(12) United States Patent
Ohashi et al.

(10) Patent No.: US 9,735,068 B2
(45) Date of Patent: Aug. 15, 2017

(54) METHOD OF MANUFACTURING SEMICONDUCTOR DEVICE

(71) Applicant: HITACHI KOKUSAI ELECTRIC INC., Tokyo (JP)

(72) Inventors: Naofumi Ohashi, Toyama (JP); Masanori Nakayama, Toyama (JP); Atsuhiko Suda, Toyama (JP); Kazuyuki Toyoda, Toyama (JP); Shun Matsui, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/015,461

(22) Filed: Feb. 4, 2016

(65) Prior Publication Data

US 2016/0293500 A1 Oct. 6, 2016

(30) Foreign Application Priority Data

Mar. 30, 2015 (JP) .................................. 2015-069000

(51) Int. Cl.
*H01L 21/00* (2006.01)
*H01L 21/66* (2006.01)
(Continued)

(52) U.S. Cl.
CPC ........ *H01L 22/20* (2013.01); *C23C 16/45502* (2013.01); *C23C 16/52* (2013.01);
(Continued)

(58) Field of Classification Search
CPC ........ H01J 37/32; C23C 16/52; C23C 16/455; C23C 16/50; H01L 21/823462; H01L 21/823857
(Continued)

(56) References Cited

U.S. PATENT DOCUMENTS 5,893,050 A 4/1999 Park et al.
7,585,386 B2 * 9/2009 Okumura .......... H01J 37/32009
118/724

(Continued)

FOREIGN PATENT DOCUMENTS

JP 07-066291 A 3/1995
JP 09-143722 A 6/1997
(Continued)

OTHER PUBLICATIONS

Japanese Office Action issued on Nov. 2, 2016 in the Japanese Application No. 2015-069000.
(Continued)

*Primary Examiner* — Sonya D McCall Shepard
(74) *Attorney, Agent, or Firm* — Volpe and Koenig, P.C.

(57) ABSTRACT

A method of manufacturing a semiconductor device includes receiving film thickness distribution data of a polished first insulating film of a substrate; calculating processing data for reducing a difference between a film thickness at a center side of the substrate and a film thickness at a periphery side of the substrate, based on the film thickness distribution data; loading the substrate into a process chamber; supplying a process gas to the substrate; and correcting a film thickness of the first insulating film based on the processing data by activating the process gas so that a concentration of active species of the process gas generated at the center side of the substrate differs from a concentration of active species of the process gas generated at the periphery side of the substrate.

16 Claims, 36 Drawing Sheets

(51) Int. Cl.
*H01L 21/02* (2006.01)
*H01L 21/3105* (2006.01)
*H01L 21/311* (2006.01)
*C23C 16/455* (2006.01)
*C23C 16/52* (2006.01)
*C23C 16/56* (2006.01)
*H01L 21/768* (2006.01)

(52) U.S. Cl.
CPC ........ *C23C 16/56* (2013.01); *H01L 21/02164* (2013.01); *H01L 21/02274* (2013.01); *H01L 21/31053* (2013.01); *H01L 21/31144* (2013.01); *H01L 21/76801* (2013.01); *H01L 21/76816* (2013.01); *H01L 21/76819* (2013.01)

(58) Field of Classification Search
USPC ........... 438/5, 758; 257/E21.211; 118/723 R, 118/729; 156/345.24
See application file for complete search history.

(56) References Cited

U.S. PATENT DOCUMENTS

| | | |
|---|---|---|
| 2005/0276928 A1 | 12/2005 | Okumura et al. |
| 2012/0164917 A1 | 6/2012 | Kobata et al. |
| 2014/0213069 A1 | 7/2014 | Takebayashi et al. |

FOREIGN PATENT DOCUMENTS

| | | |
|---|---|---|
| JP | 11-176821 A | 7/1999 |
| JP | 2000-353693 A | 12/2000 |
| JP | 2012-138442 A | 7/2012 |
| JP | 2012-151504 A | 8/2012 |

OTHER PUBLICATIONS

Taiwanese Office Action issued on Jan. 5, 2017 in the Taiwanese Application No. 105103767.

* cited by examiner

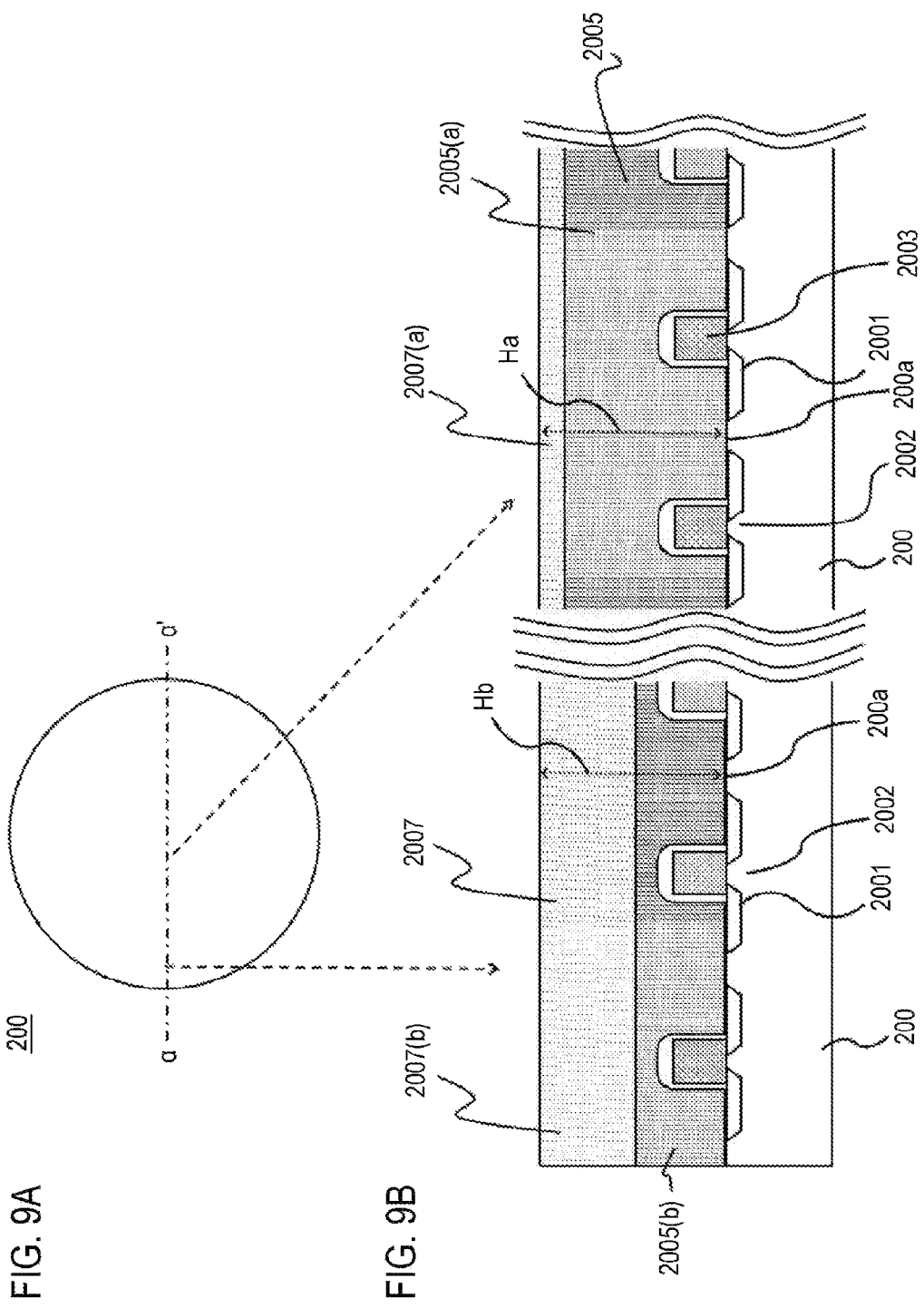

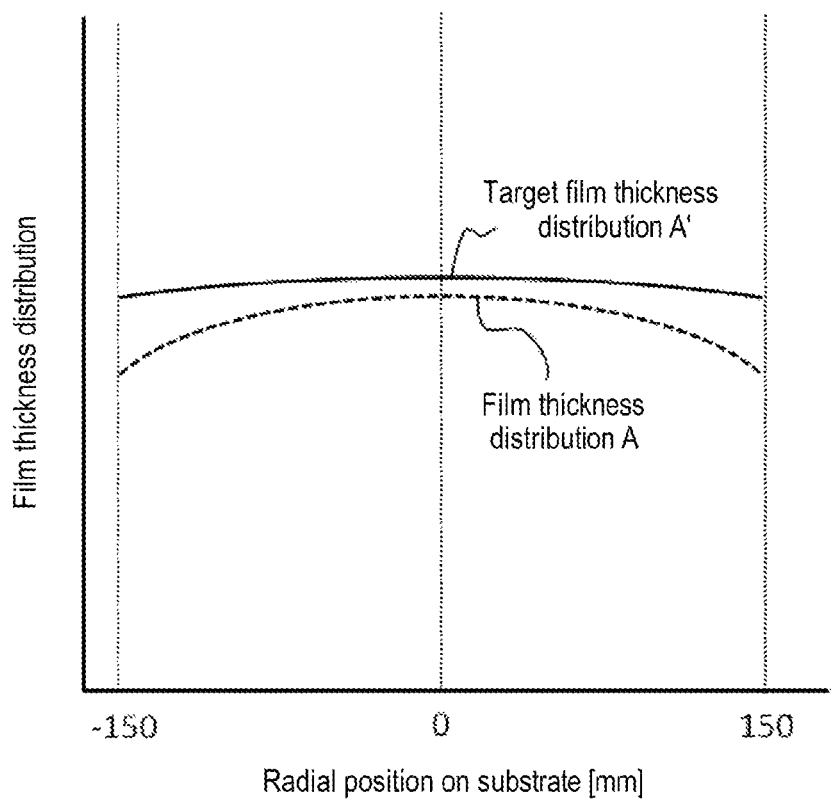

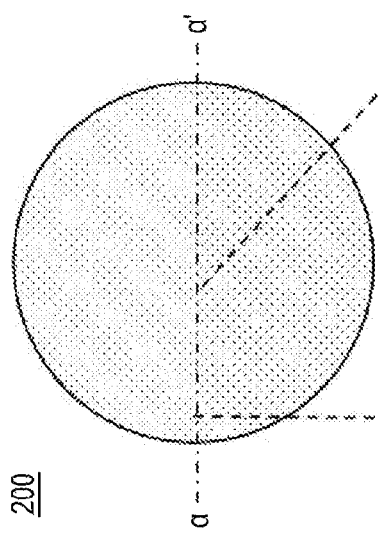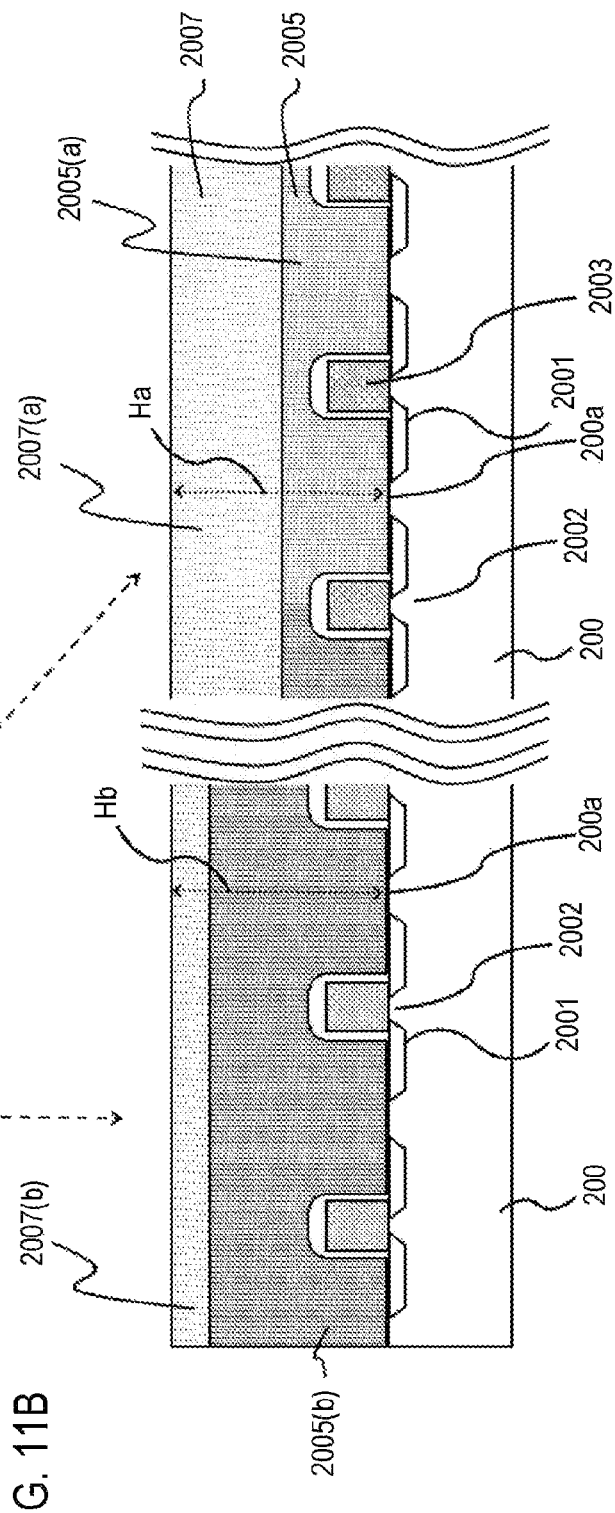
FIG. 11A
FIG. 11B

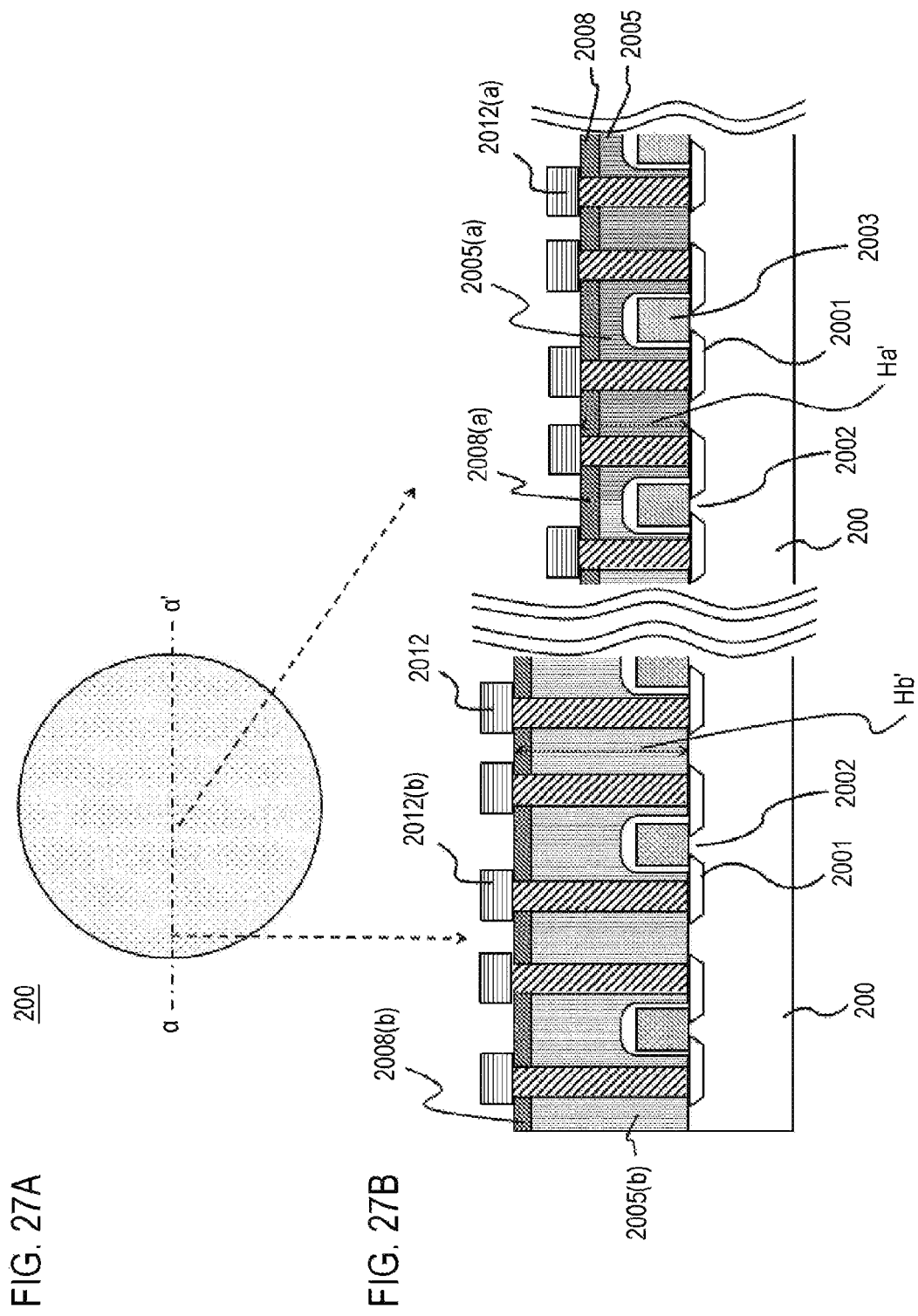

FIG. 32

|  | S4002 | S4003 | S4004 | S4005 |
|---|---|---|---|---|
| Process gas supply | | ▁▁▁ | ▁▁▁ | ┐ |
| Power to first coil | | | ▁▁▁ | |
| Power to second coil | | | ▁▁▁ | |
| Electric potential of first bias electrode | ▁▁▁ | ▁▁▁ | ▁▁▁ | |
| Electric potential of second bias electrode | ▁▁▁ | ▁▁▁ | ▁▁▁ | |
| Purge | | | | ▁▁▁ |

# METHOD OF MANUFACTURING SEMICONDUCTOR DEVICE

CROSS-REFERENCE TO RELATED APPLICATION

This application is based upon and claims the benefit of priority from Japanese Patent Application No. 2015-069000, filed on Mar. 30, 2015, the entire contents of which are incorporated herein by reference.

TECHNICAL FIELD

The present disclosure relates to a method of manufacturing a semiconductor device, a recording medium and a substrate processing apparatus.

BACKGROUND

Recently, semiconductor devices tend to be highly integrated. In line with the tendency of high integration of semiconductor devices, pattern sizes have been remarkably miniaturized. The patterns are formed through a hard mask or resist forming process, a lithography process, an etching process and the like. When forming the patterns, a variation in the characteristics of the semiconductor devices should be prevented.

However, a variation in a width of a circuit or the like to be formed may occur due to processing problems. In particular, such a variation may significantly affect the characteristics of semiconductor devices with miniaturized patterns.

SUMMARY

The present disclosure provides some embodiments of a technique capable of suppressing a variation in characteristics of a semiconductor device.

According to one embodiment, there is provided a technique, including: receiving film thickness distribution data of a polished first insulating film of a substrate; calculating processing data for reducing a difference between a film thickness at a center side of the substrate and a film thickness at a periphery side of the substrate, based on the film thickness distribution data; loading the substrate into a process chamber; supplying a process gas to the substrate; and correcting a film thickness of the first insulating film based on the processing data by activating the process gas so that a concentration of active species of the process gas generated at the center side of the substrate differs from a concentration of active species of the process gas generated at the periphery side of the substrate.

BRIEF DESCRIPTION OF THE DRAWINGS

FIGS. 9A and 9B are explanatory views illustrating a processing state of a wafer according to an embodiment.

FIG. 10 illustrates film thickness distribution examples before and after correction according to an embodiment.

FIGS. 11A and 11B are explanatory views illustrating a processing state of a wafer according to an embodiment.

FIGS. 27A and 27B are explanatory views illustrating a processing state of a wafer according to a comparative example.

FIG. 32 illustrates a substrate processing sequence example according to another embodiment.

DETAILED DESCRIPTION

Embodiments of the present disclosure will now be described.

Initially, one of processes of manufacturing a semiconductor device will be described with reference to FIGS. 1 to 12.

Figure 1:
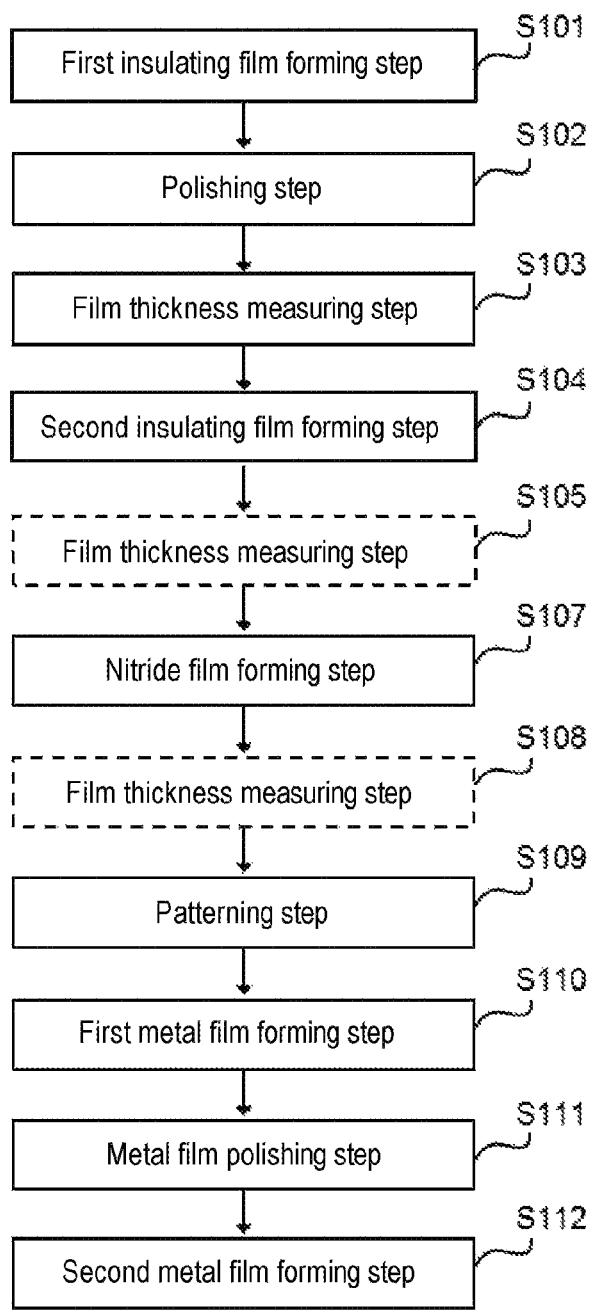
FIG. 1 is an explanatory view of a manufacturing flow of a semiconductor device according to an embodiment.
Figure 2:
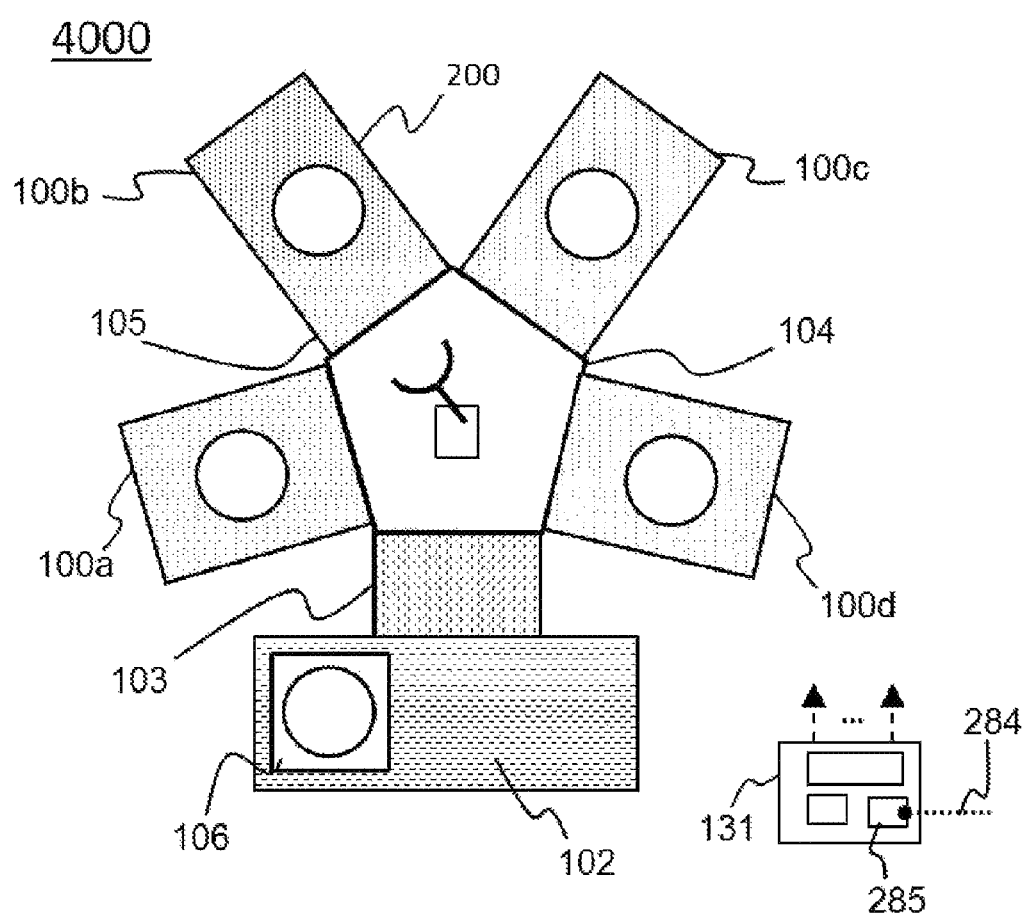
FIG. 2 illustrates a schematic configuration example of a processing system for performing the manufacture of a semiconductor device according to an embodiment.

As shown in FIG. 1, a semiconductor device is manufactured by, for example, a processing system 4000 illustrated in FIG. 2.

(First Insulating Film Forming Step S101)

Figure 3:
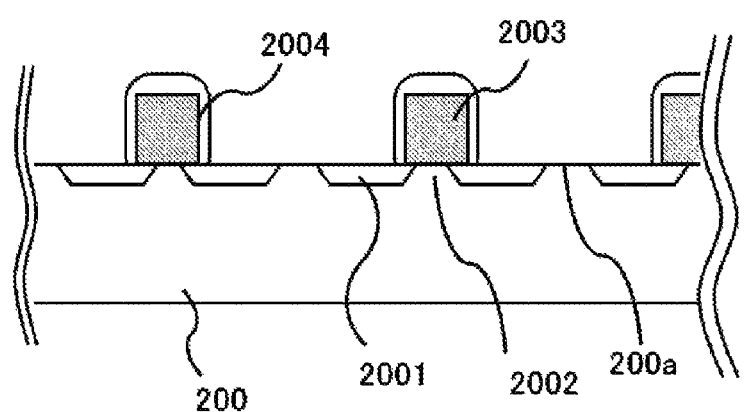
FIG. 3 is an explanatory view illustrating a processing state of a wafer according to an embodiment.
Figure 4:
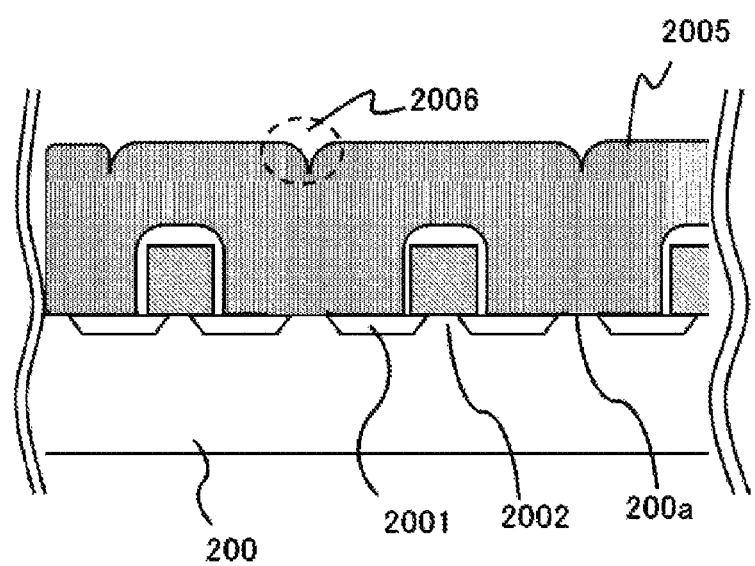
FIG. 4 is an explanatory view illustrating a processing state of a wafer according to an embodiment.

With regard to a first insulating film forming step S101, a wafer 200 will be described with reference to FIGS. 3 and 4. FIG. 3 illustrates a state before an interlayer insulating film is formed.

Source/drain regions 2001, each of which is configured by a source or a drain, are formed in the wafer 200. Channel regions 2002 are formed between the source/drain regions 2001. On a surface 200a of the wafer 200, gate electrodes 2003 are formed above the respective channel regions 2002. Outer walls 2004 serving to suppress a current flow from sidewalls of the gate electrodes 2003 are formed around the gate electrodes 2003.

Subsequently, a first insulating film forming step S101 will be described with reference to FIG. 3. If the wafer 200 is loaded into a substrate processing apparatus (first-insulating-film forming apparatus) 100a which forms a first insulating film, a silicon-containing gas and an oxygen-containing gas are supplied into a process chamber of the substrate processing apparatus. The gases thus supplied react within the process chamber to form an interlayer insulating film 2005 (simply referred to as an insulating film) which insulates circuits or electrodes adjoining each other. The insulating film 2005 is formed of, e.g., a silicon oxide film ($SiO_2$ film). The silicon-containing gas may be, e.g., TEOS (tetraethyl orthosilicate, $Si(OC_2H_5)_4$). The oxygen-containing gas may be, e.g., an oxygen gas ($O_2$). The insulating film 2005 is used as an interlayer insulating film.

If the insulating film 2005 is formed on the wafer 200 after the lapse of a predetermined time period, the wafer 200 is unloaded from the substrate processing apparatus.

The insulating film 2005 thus formed will now be described with reference to FIG. 4. As already described, a plurality of gate electrodes 2003 having a convex shape is formed in the wafer 200. In the case where a film is formed on the wafer 200 of this state, the heights from the substrate surface 200a to the upper end of the insulating film 2005 are not aligned with each other, as shown in FIG. 3. Thus, the heights from the substrate surface 200a to the upper end of the insulating film 2005 vary in the wafer plane. For example, the height of the insulating film formed between the gate electrodes 2003 becomes smaller than the height of the insulating film formed on the gate electrodes 2003. Consequently, dents 2006 are formed. The wafer 200 is unloaded from the process chamber after the insulating film 2005 is formed.

However, in view of the relationship between a patterning step S109 and either or both of a first metal film forming step S110 and a second metal film forming step S112 which will be described later, there is required a state in which the dents 2006 do not exist. Thus, in order to eliminate the dents 2006, the insulating film 2005 is polished in the next polishing step S102.

(Insulating Film Polishing Step S102)

Next, the insulating film polishing step S102 of polishing the insulating film 2005 will be described. The polishing step is also referred to as a CMP (Chemical Mechanical Polishing) step. The wafer 200 unloaded from the first-insulating-film forming apparatus is loaded into a polishing apparatus 400 (100b).

Details of the polishing step will be described below. After unloaded from the first-insulating-film forming apparatus, the wafer 200 is loaded into the polishing apparatus 400 (100b) illustrated in FIG. 5.

Figure 5:
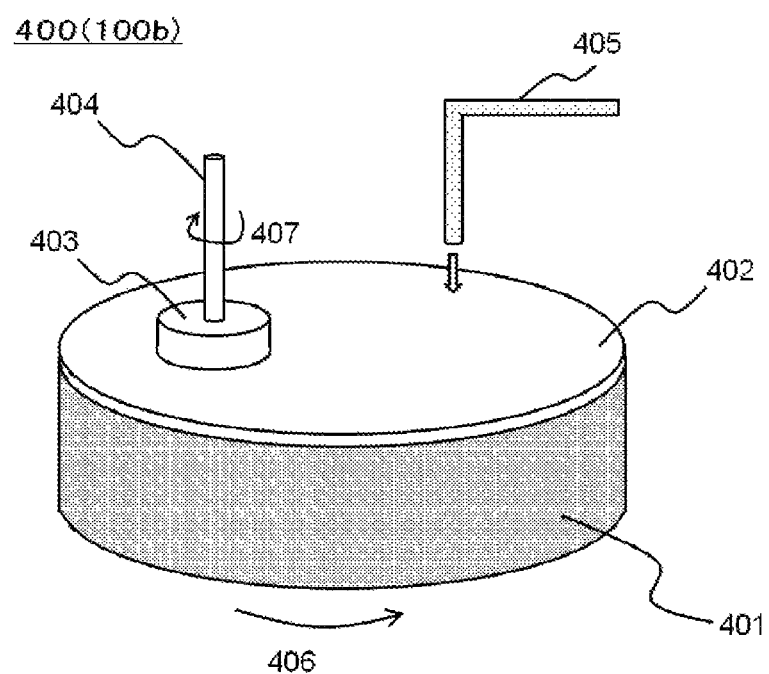
FIG. 5 is an explanatory view of a polishing apparatus according to an embodiment.

In FIG. 5, reference numeral 401 denotes a polishing disc and reference numeral 402 denotes an abrasive cloth which polishes the wafer 200. The polishing disc 401 is connected to a rotation mechanism (not shown). When polishing the wafer 200, the polishing disc 401 rotates in a direction of an arrow 406.

Reference numeral 403 denotes a polishing head. A shaft 404 is connected to an upper surface of the polishing head 403. The shaft 404 is connected to a rotation mechanism and a vertical drive mechanism (not shown). While polishing the wafer 200, the shaft 404 rotates in a direction of an arrow 407.

Reference numeral 405 denotes a supply pipe configured to supply slurry (abrasive). While the wafer 200 is being polished, the slurry is supplied from the supply pipe 405 to the abrasive cloth 402.

Figure 6:
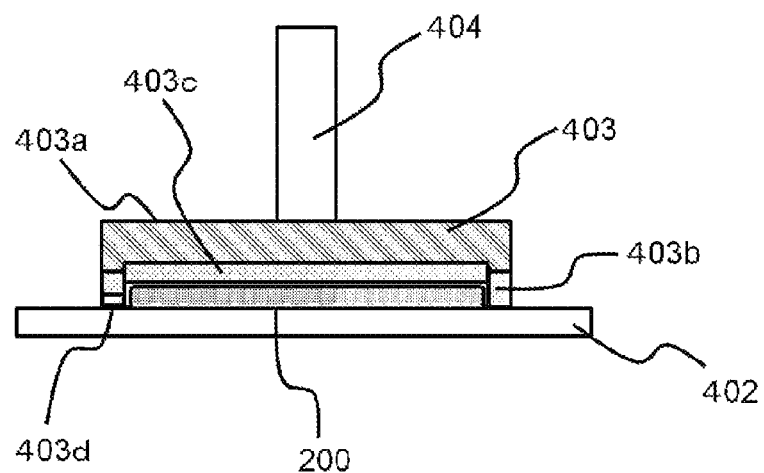
FIG. 6 is an explanatory view of a polishing apparatus according to an embodiment.

Subsequently, details of the polishing head 403 and a peripheral structure thereof will be described with reference to FIG. 6. FIG. 6 is a cross-sectional view illustrating the polishing head 403 and a peripheral structure thereof. The polishing head 403 includes a top ring 403a, a retainer ring 403b and an elastic mat 403c. While the wafer 200 is being polished, the outer side of the wafer 200 is surrounded by the retainer ring 403b and the wafer 200 is pressed against the abrasive cloth 402 by the elastic mat 403c. Grooves 403d are formed in the retainer ring 403b to allow the slurry to pass through the grooves 403d from an outer side of the retainer ring to an inner side thereof. The grooves 403d are formed in a plural number along a circumferential direction in conformity with the shape of the retainer ring 403b. Used slurry is replaced by fresh slurry through the grooves 403d.

Figure 7:
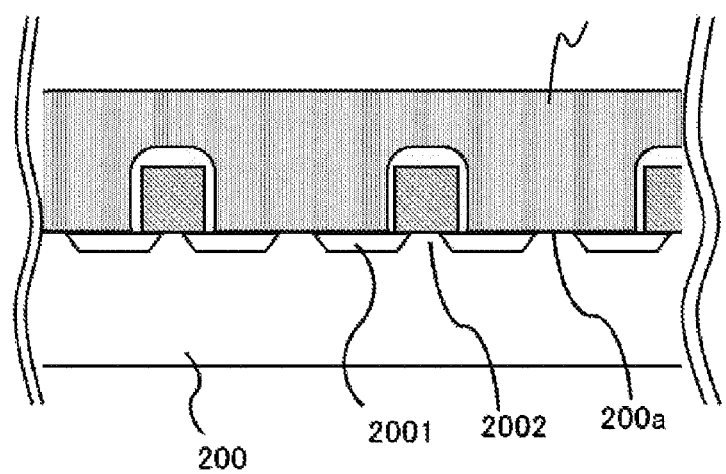
FIG. 7 is an explanatory view illustrating a processing state of a wafer according to an embodiment.

Subsequently, an operation at this step will be described. When the wafer 200 is loaded into the polishing head 403, the slurry is supplied from the supply pipe 405 and the polishing disc 401 and the polishing head 403 are rotated. The slurry flows into the retainer ring 403b to polish a surface of the wafer 200. Through this polishing, as illustrated in FIG. 7, the heights of the insulating film 2005 can be aligned with each other. After the wafer 200 is polished for a predetermined period of time, the wafer 200 is unloaded. The term "height" used herein refers to a height from the wafer surface 200a to the upper end of the insulating film 2005, namely to the surface of the insulating film 2005.

Figure 8:
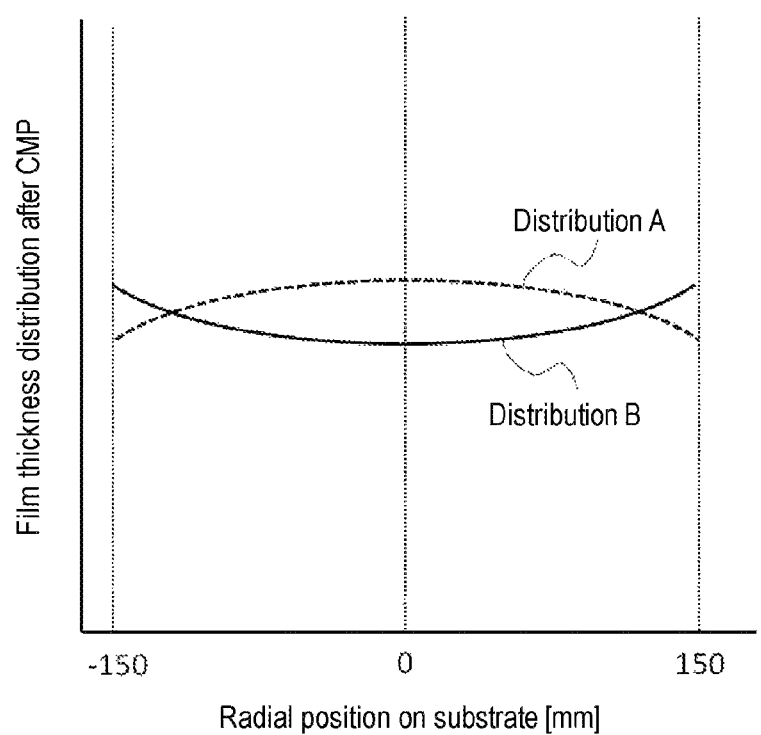
FIG. 8 illustrates a film thickness distribution example after a CMP step according to an embodiment.

Through the investigation of an in-plane film thickness distribution of the polished insulating film 2005, it has been found that the heights of the insulating film may not be aligned in the plane of the wafer 200 as illustrated in FIG. 8. For example, it has been found that there may appear distribution A in which a film thickness of a peripheral surface of the wafer 200 is smaller than a film thickness of a central surface thereof or distribution B in which a film thickness of a central surface of the wafer 200 is smaller than a film thickness of a peripheral surface thereof.

When there is a bias in the film thickness distribution, a problem is posed in that a variation in a width of a pattern occurs at a patterning step which will be described later. Similarly, a problem is posed in that a variation in a height from the wafer surface 200a to a metal film surface is generated at a first metal film forming step which will be described later. Due to these variations, a reduction of yield rate may occur.

According to the results of extensive researches on this problem conducted by the inventors, it has been found that distribution A and distribution B have their own causes. The causes will be described hereinafter.

The cause of distribution A resides in a supply method of slurry with respect to the wafer. As set forth above, the slurry supplied to the abrasive cloth 402 is supplied from the periphery of the wafer 200 through the retainer ring 403b. Thus, the slurry used to polish the peripheral surface of the wafer 200 flows toward the central surface of the wafer 200, while unused fresh slurry flows onto the peripheral surface of the wafer 200. Since the fresh slurry has high polishing efficiency, the peripheral surface of the wafer 200 is polished more heavily than the central surface of the wafer 200. It is considered from the foregoing that the film thickness of the insulating film 2005 has distribution A.

The cause of distribution B resides in the wear of the retainer ring 403b. When a large number of wafers 200 are polished by the polishing apparatus 400, a front end of the retainer ring 403b pressed against the abrasive cloth 402 is worn and the grooves 403d or the surface of the retainer ring 403b making contact with the abrasive cloth 402 is deformed. For this reason, there may be a case where slurry to be supplied is not be supplied to a central surface of the retainer ring 403b. In this case, the slurry is not supplied to the peripheral surface of the wafer 200. Therefore, the central surface of the wafer 200 is polished while the peripheral surface thereof is not polished. Thus, it is considered that the film thickness of the insulating film 2005 has distribution B.

Accordingly, in the present embodiment, as will be described later, correction is performed so as to align the heights of the insulating film in the substrate plane. Specifically, after the polishing step S102, the film thickness distribution of the insulating film 2005 is measured at a film thickness measuring step S103. A second interlayer insulating film forming step S104 is performed according to the measurement data. By doing so, it is possible to suppress a variation in a pattern width at a patterning step which will be described later. Similarly, at a first metal film forming step which will be described later, it is possible to suppress a variation in the height from the wafer surface 200a to the surface of a metal film.

(Film Thickness Measuring Step S103)

Subsequently, a film thickness measuring step S103 will be described. At the film thickness measuring step S103, the film thickness of the insulating film 2005 which has been subjected to the polishing is measured using a measuring apparatus. Since a general measuring apparatus can be used as the measuring apparatus, detailed descriptions thereof will be omitted. The term "film thickness" used herein refers to, for example, a height from the wafer surface 200a to the surface of the insulating film 2005.

After the polishing step S102, the wafer 200 is loaded into a measuring apparatus 100c. The measuring apparatus measures a film thickness (height) distribution of the insulating film 2005 by measuring film thicknesses of at least some points of the central surface and the peripheral surface of the wafer 200 that may be easily affected by the polishing apparatus 400. The measurement data are transmitted to a host device. After the measurement, the wafer 200 is unloaded from the measuring apparatus.

(Second Insulating Film Forming Step S104)

Subsequently, a second interlayer insulating film forming step will be described. The second insulating film is identical in component and composition with the first insulating film 2005. At this step, as illustrated in FIGS. 9A and 9B or FIGS. 11A and 11B, a second insulating film 2007 (also referred to as an insulating film 2007) is formed on the first interlayer insulating film 2005 which has been subjected to the polishing. In the subject specification, a film obtained by overlapping the first insulating film 2005 and the second insulating film 2007 with each other is referred to as a laminated insulating film.

The second insulating film 2007 (also referred to as an insulating film 2007 or a corrected film 2007) is formed so as to correct the film thickness distribution of the first interlayer insulating film 2005 which has been subjected to the polishing. Preferably, the insulating film 2007 is formed to align the surface heights of the insulating film 2007. The term "height" used herein refers to a surface height of the insulating film 2007, namely a distance from the wafer surface 200a to the surface of the insulating film 2007.

Figure 12:
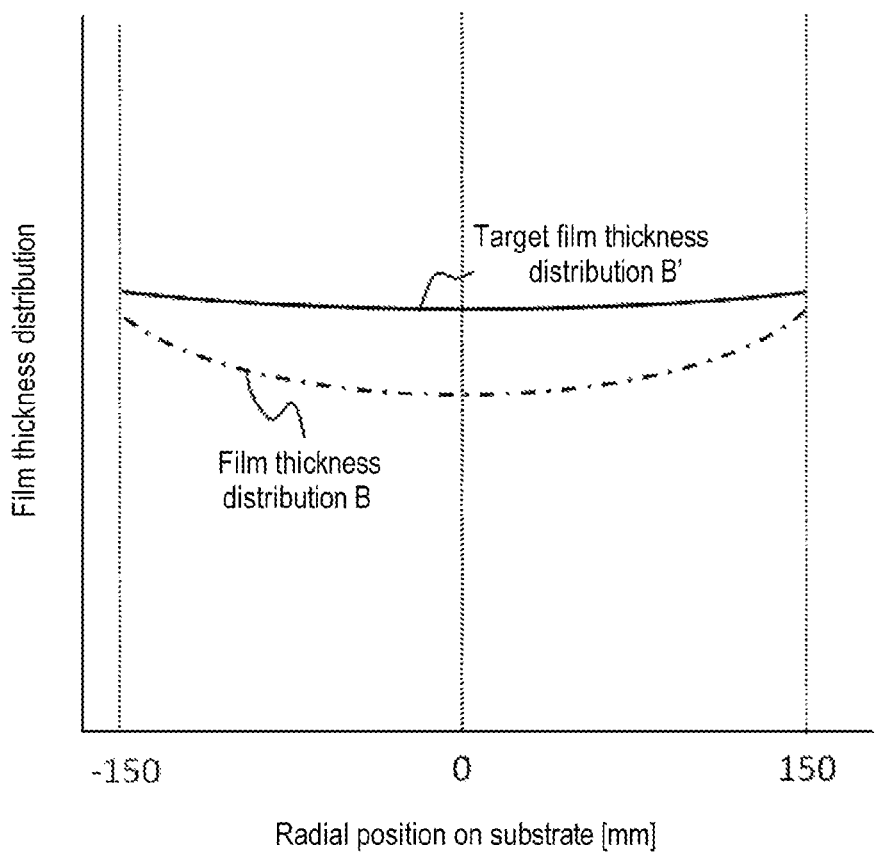
FIG. 12 illustrates film thickness distribution examples before and after correction according to an embodiment.

Hereinafter, this step will be described with reference to FIGS. 9A to 12. FIGS. 9A and 9B are views illustrating a case where the first insulating film 2005 has distribution A. FIG. 10 is an explanatory view illustrating film thickness distribution A and corrected film thickness distribution A'. FIGS. 11A and 11B are views illustrating a case where the first insulating film 2005 has distribution B. FIG. 12 is an explanatory view illustrating film thickness distribution B and corrected film thickness distribution B'. FIGS. 13 to 19 are views illustrating a substrate processing apparatus for realizing this step.

FIG. 9A is a top view illustrating the wafer 200 available after the insulating film 2007 is formed. FIG. 9B is a view illustrating the center and outer periphery of the wafer 200 excerpted from a cross-section taken along line α-α' in FIG. 9A.

In the subject specification, the first insulating film existing on the central surface of the wafer will be referred to as an insulating film 2005a and the second insulating film existing on the central surface of the wafer will be referred to as an insulating film 2007a. The first insulating film existing on the peripheral surface of the wafer will be referred to as an insulating film 2005b and the second insulating film existing on the peripheral surface of the wafer will be referred to as an insulating film 2007b.

Figure 13:
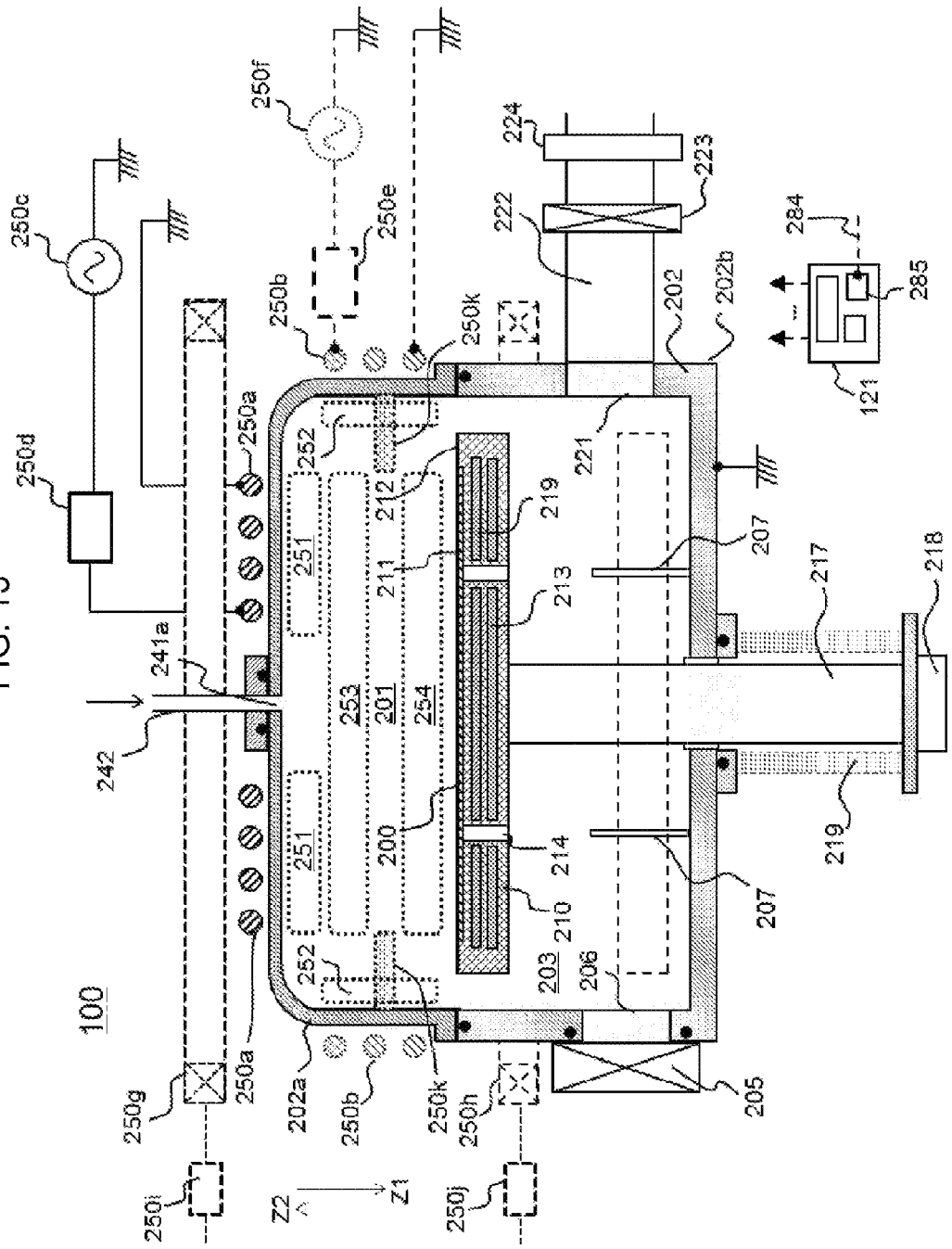
FIG. 13 is an explanatory view illustrating a substrate processing apparatus according to an embodiment.

The wafer 200 unloaded from the measuring apparatus 100c is loaded into the substrate processing apparatus 100 (100d) for forming the second insulating film illustrated in FIG. 13.

The substrate processing apparatus 100 controls the film thickness of the insulating film 2007 in the substrate plane based on the film thickness distribution data measured at the film thickness measuring step S103. First, predetermined processing data are calculated by a controller 121 based on the data received from a reception part 285 installed in the controller 121. For example, if the received data are data indicative of distribution A, the substrate processing apparatus 100 controls the film thickness such that the thickness of the insulating film 2007b on the peripheral surface of the wafer becomes larger and such that the insulating film 2007a on the central surface of the wafer becomes thinner than the insulating film 2007b on the peripheral surface of the wafer. Furthermore, if the received data are data indicative of distribution B, the substrate processing apparatus 100 controls the film thickness such that the thickness of the insulating film 2007a on the central surface of the wafer 200 becomes larger and such that the insulating film 2007b on the peripheral surface of the wafer 200 becomes thinner than the insulating film 2007a on the central surface of the wafer 200.

Preferably, the thickness of the second insulating film is controlled such that the height of the first insulating film and the second insulating film overlapped with each other falls within a predetermined range in the wafer plane. In other words, the heights are aligned by controlling the film thickness distribution of the second insulating film such that the height distribution of the second insulating film in the substrate plane falls within a predetermined range. That is to say, as illustrated in FIGS. 9A, 9B, 11A and 11B, the height H1a from the wafer surface 200a to the upper end of the second insulating film 2007a on the central surface of the wafer 200 and the height H1b from the wafer surface 200a to the upper end of the second insulating film 2007b on the peripheral surface of the wafer can be aligned with each other.

Next, the substrate processing apparatus 100 for forming the second insulating film 2007, which is capable of controlling the film thickness of each of the insulating films 2007a and 2007b, will be described in detail.

The substrate processing apparatus 100 according to the present embodiment will be described. As illustrated in FIG. 13, the substrate processing apparatus 100 is configured as a single-substrate-type substrate processing apparatus. The substrate processing apparatus 100 is used in one of processes of manufacturing a semiconductor device. In the present embodiment, the substrate processing apparatus 100 is used at least in a second interlayer insulating film forming step S104.

As illustrated in FIG. 13, the substrate processing apparatus 100 includes a process vessel 202. The process vessel 202 is configured as, e.g., a flat airtight vessel having a circular horizontal cross-section. A process space (process chamber) 201, in which the wafer 200 such as a silicon wafer as a substrate is processed, and a transfer space 203 are formed in the process vessel 202. The process vessel 202 is configured by an upper vessel 202a and a lower vessel 202b. The upper vessel 202a is made of a non-metallic material such as, e.g., quartz or ceramics. The lower vessel 202b is made of a metallic material such as, e.g., aluminum (Al) or stainless steel (SUS), or quartz. The space existing above a substrate mounting stand 212 is called the process space 201. The space surrounded by the lower vessel 202b and provided below the substrate mounting stand 212 is called the transfer space 203.

A substrate loading/unloading port 206 adjacent to a gate valve 205 is formed on a side surface of the lower vessel 202b. The wafer 200 moves into and out of a transfer chamber 104 through the substrate loading/unloading port 206. A plurality of lift pins 207 is installed in a bottom portion of the lower vessel 202b. In addition, the lower vessel 202b is kept at an earth potential.

(Substrate Mounting Stand)

A substrate support part 210 configured to support the wafer 200 is installed in the process chamber 201. The substrate support part (susceptor) 210 mainly includes a mounting surface 211 on which the wafer 200 is mounted, a substrate mounting stand 212 having the mounting surface 211 on a surface thereof, and a heater 213 as a heating part installed within the substrate mounting stand 212. Through-holes 214 through which the lift pins 207 pass is formed in the substrate mounting stand 212 in such positions corresponding to the lift pins 207, respectively.

The substrate mounting stand 212 is supported by a shaft 217. The shaft 217 passes through a bottom portion of the process vessel 202. Furthermore, the shaft 217 is connected to an elevator mechanism 218 outside the process vessel 202. By operating the elevator mechanism 218 to move the shaft 217 and the substrate mounting stand 212 up and down, it is possible to move the wafer 200 mounted on the mounting surface 211 up and down. Further, the periphery of the lower end of the shaft 217 is covered with a bellows 219 so that the inside of the process space 201 is kept airtight.

When transferring the wafer 200, the substrate mounting stand 212 is moved down to a substrate support stand such that the mounting surface 211 is located in a position of the substrate loading/unloading port 206 (or a wafer transfer position). When processing the wafer 200, as shown in FIG. 13, the substrate mounting stand 212 is moved up until the wafer 200 reaches a processing position (or a wafer processing position) within the process space 201.

Specifically, when the substrate mounting stand 212 is moved down to the wafer transfer position, the upper end portions of the lift pins 207 protrude from an upper surface of the mounting surface 211 so that the lift pins 207 support the wafer 200 from below. Further, when the substrate mounting stand 212 is moved up to the wafer processing position, the lift pins 207 are retracted from the upper surface of the mounting surface 211 so that the mounting surface 211 supports the wafer 200 from below. In addition, the lift pins 207 are preferably made of a material such as, e.g., quartz, alumina or the like, because the lift pins 207 make direct contact with the wafer 200.

Figure 14:
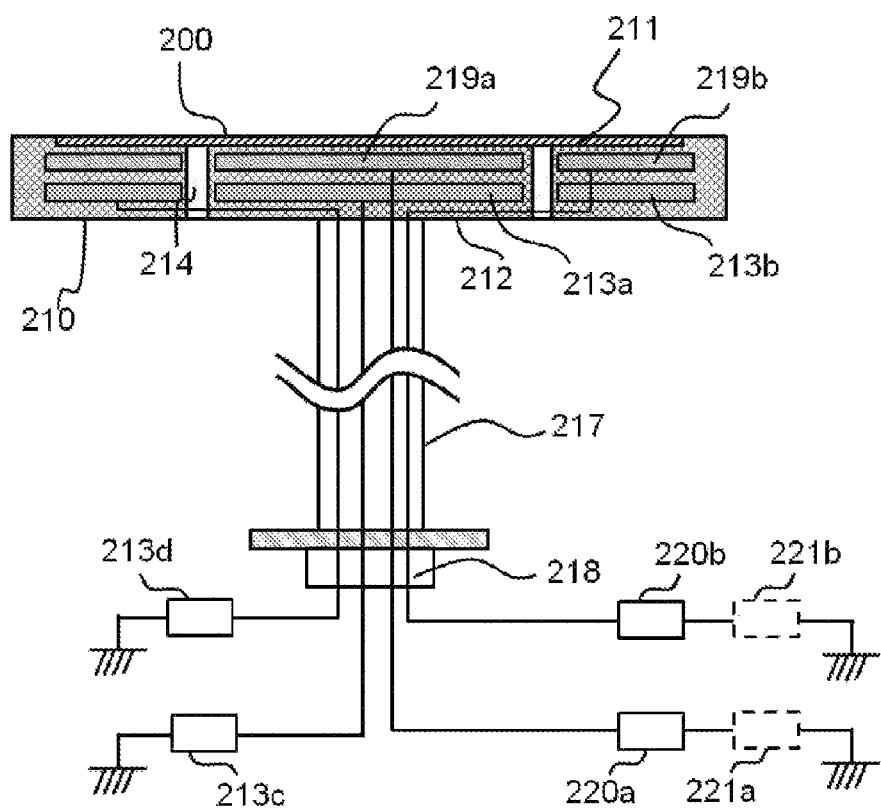
FIG. 14 is an explanatory view illustrating a substrate support part according to an embodiment.
Figure 15:
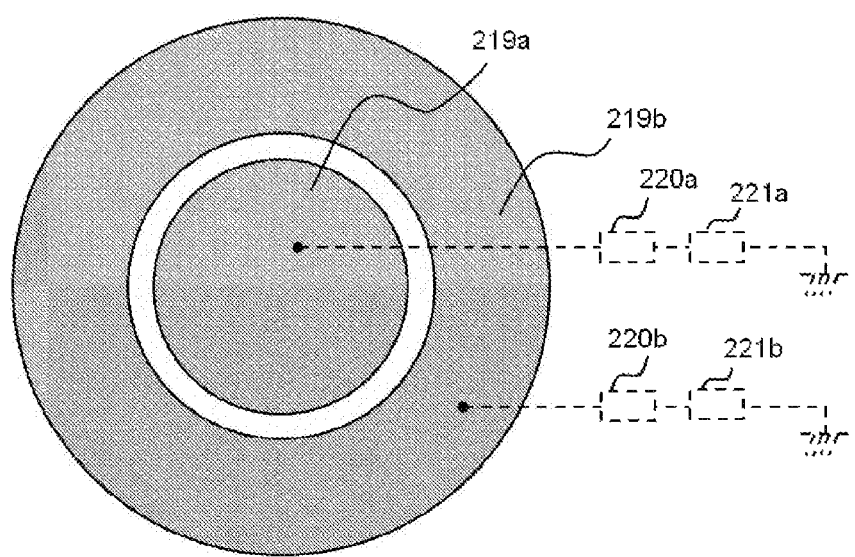
FIG. 15 is an explanatory view illustrating the substrate support part according to an embodiment.

As illustrated in FIG. 14, a first bias electrode 219a and a second bias electrode 219b, which serve as a bias adjusting part 219, are installed in the substrate mounting stand 212. The first bias electrode 219a is connected to a first impedance adjusting part 220a and the second bias electrode 219b is connected to a second impedance adjusting part 220b so that the electric potentials of the respective electrodes can be adjusted. As illustrated in FIG. 15, the first bias electrode 219a and the second bias electrode 219b are formed in a concentric shape and are configured to adjust an electric potential at the center side of the substrate and an electric potential at the periphery side of the substrate.

Furthermore, it may be possible to employ a configuration in which a first impedance adjusting power source 221a is installed in the first impedance adjusting part 220a and a second impedance adjusting power source 221b is installed in the second impedance adjusting part 220b. By installing the first impedance adjusting power source 221a, it is possible to expand an adjustment width of an electric potential of the first bias electrode 219a and to expand an adjustment width of an amount of active species introduced toward the center of the substrate 200. Furthermore, by installing the second impedance adjusting power source 221b, it is possible to expand an adjustment width of an electric potential of the second bias electrode 219b and to expand an adjustment width of an amount of active species introduced toward the periphery of the substrate 200. For example, if the active species have a positive electric potential, the electric potential of the first bias electrode 219a may be allowed to become negative and the electric potential of the second bias electrode 219b may be allowed to become higher than the electric potential of the first bias electrode 219a, whereby the amount of the active species supplied to the center of the substrate 200 can be made larger than the amount of the active species supplied to the periphery of the substrate 200. Even when the electric potential of the active species generated within the process chamber 201 is close to neutral, the amount of the active species introduced toward the substrate 200 can be adjusted by using one or both of the first impedance adjusting power source 221a and the second impedance adjusting power source 221b.

As the heater 213, it may be possible to install a first heater 213a and a second heater 213b. The first heater 213a is installed to face the first bias electrode 219a. The second heater 213b is installed to face the second bias electrode 219b. The first heater 213a is connected to a first heater power source 213c and the second heater 213b is connected to a second heater power source 213d so that an amount of electric power supplied to each of the heaters can be adjusted.

(Activation Part)

As illustrated in FIG. 13, a first coil 250a as a first activation part (side activation part) is installed above the upper vessel 202a. A first high-frequency power source 250c is connected to the first coil 250a via a first matching box 250d. By supplying high-frequency power to the first coil 250a, it is possible to excite a gas supplied into the process chamber 201 and to generate plasma. In particular, plasma is generated in a space (first plasma generating region 251) existing in the upper portion of the process chamber 201 and facing the substrate 200. It may be possible to employ a configuration in which plasma is generated in a space facing the substrate mounting stand 212.

Furthermore, as illustrated in FIG. 13, a second coil 250b as a second activation part (upper activation part) may be installed at a lateral side of the upper vessel 202a. A second high-frequency power source 250f is connected to the second coil 250b via a second matching box 250e. By supplying high-frequency power to the second coil 250b, it is possible to excite a gas supplied into the process chamber 201 and to generate plasma. In particular, plasma is generated in a space (second plasma generating region 252) existing in the side portion of the process chamber 201 and existing more outward than the space facing the substrate 200. It may be possible to employ a configuration in which plasma is generated in a space existing more outward than the space facing the substrate mounting stand 212.

In the present embodiment, there has been illustrated an example in which the matching boxes and the high-frequency power sources are independently installed in the first activation part and the second activation part. However, the present disclosure is not limited thereto. It may be configured to use a matching box common to the first coil 250a and the second coil 250b. Moreover, it may be configured to use a high-frequency power source common to the first coil 250a and the second coil 250b.

(Magnetic Force Generating Part (Magnetic Field Generating Part))

As illustrated in FIG. 13, a first electromagnet (upper electromagnet) 250g as a first magnetic force generating part (first magnetic field generating part) may be installed above the upper vessel 202a. A first electromagnet power source 250i for supplying electric power to the first electromagnet 250g is connected to the first electromagnet 250g. Furthermore, the first electromagnet 250g is formed in a ring shape and is configured to generate a magnetic force (magnetic field) in a Z1 or Z2 direction as illustrated in FIG. 13. The direction of the magnetic force (magnetic field) is controlled by the direction of an electric current supplied from the first electromagnet power source 250i.

Furthermore, a second electromagnet (side electromagnet) 250h as a second magnetic force generating part (second magnetic field generating part) may be installed on the side surface of the process vessel 202. A second electromagnet power source 250j for supplying electric power to the second electromagnet 250h is connected to the second electromagnet 250h. Furthermore, the second electromagnet 250h is formed in a ring shape and is configured to generate a magnetic force (magnetic field) in a Z1 or Z2 direction as illustrated in FIG. 13. The direction of the magnetic force (magnetic field) is controlled by the direction of an electric current supplied from the second electromagnet power source 250j.

By forming a magnetic force (magnetic field) in a Z1 direction using one of the first electromagnet 250g and the second electromagnet 250h, it is possible to move (diffuse) the plasma generated in the first plasma generating region 251 toward a third plasma generating region 253 or a fourth plasma generating region 254. In the third plasma generating region 253, the degree of activity of active species generated in a position facing the center of the substrate 200 becomes higher than the degree of activity of active species generated in a position facing the periphery of the substrate 200. This is because a gas introduction port 241a is formed in a position facing the center of the substrate 200 and, therefore, fresh gas molecules are supplied to the center of the substrate 200. Furthermore, in the fourth plasma generating region 254, the degree of activity of active species generated in a position facing the periphery of the substrate 200 becomes higher than the degree of activity of active species generated in a position facing the center of the substrate 200. This is because an exhaust path is formed at the side of the periphery of the substrate support part 210 and, therefore, gas molecules are collected at the side of the periphery of the substrate 200. The position of plasma can be controlled by the electric power supplied to the first electromagnet 250g and the second electromagnet 250h. By increasing the electric power, it is possible to bring the plasma close to the substrate 200. Furthermore, by forming a magnetic force (magnetic field) in a Z1 direction using the first electromagnet 250g and the second electromagnet 250h, it is possible to bring the plasma closer to the substrate 200. Moreover, by forming a magnetic force (magnetic field) in a Z2 direction, it is possible to restrain the plasma generated in the first plasma generating region 251 from being diffused toward the substrate 200 and to reduce the energy of active species supplied to the substrate 200. It may be configured so that the direction of a magnetic field formed by the first electromagnet 250g and the direction of a magnetic force (magnetic field) formed by the second electromagnet 250h differ from each other.

A magnetic shielding plate 250k may be installed between the first electromagnet 250g and the second electromagnet 250h within the process chamber 201. By installing the magnetic shielding plate 250k, it is possible to separate the magnetic force (magnetic field) formed by the first electromagnet 250g and the magnetic force (magnetic field) formed by the second electromagnet 250h. By adjusting the respective magnetic fields, it becomes easy to adjust the in-plane processing uniformity of the substrate 200. Moreover, it may be configured so that the height of the magnetic shielding plate 250k can be adjusted by a magnetic shielding plate elevator mechanism (not illustrated).

(Exhaust System)

An exhaust port 221 as an exhaust part for exhausting an atmosphere of the process space 201 is formed in the inner wall of the transfer space 203 (the lower vessel 202b). An exhaust pipe 222 is connected to the exhaust port 221. A pressure regulator 223 such as an auto pressure controller (APC) or the like, which controls the internal pressure of the process space 201 at a predetermined pressure, and a vacuum pump 224 are sequentially and serially connected to the exhaust pipe 222. An exhaust system (exhaust line) is mainly configured by the exhaust port 221, the exhaust pipe 222 and the pressure regulator 223. In addition, the vacuum pump 224 may be added to a portion of the configuration of the exhaust system (exhaust line).

(Gas Introduction Port)

A gas introduction port 241a for supplying various kinds of gases into the process space 201 is formed in the top portion of the upper vessel 202a. A common gas supply pipe 242 is connected to the gas introduction port 241a.

(Gas Supply Part)

Figure 16:
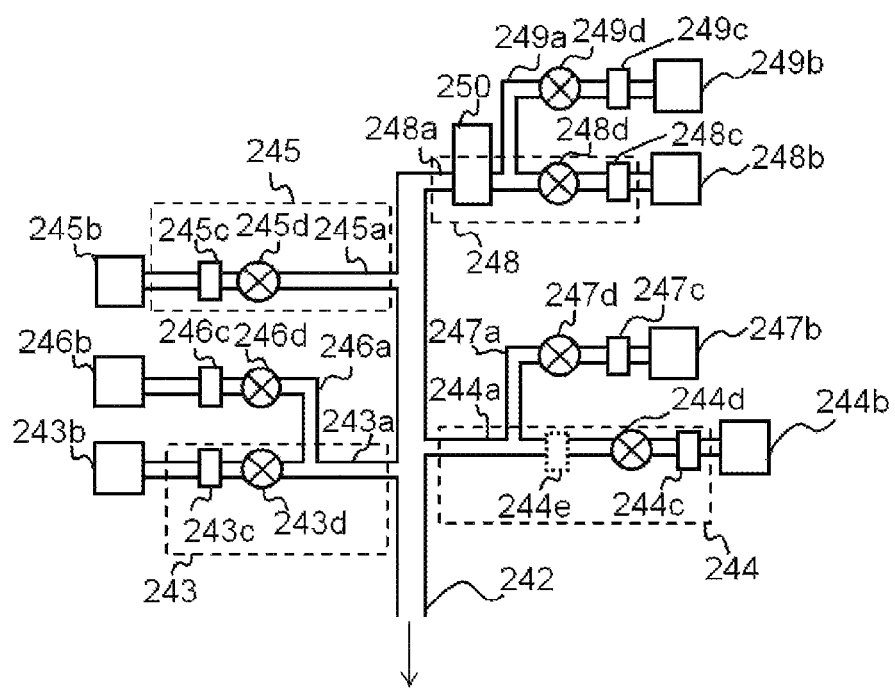
FIG. 16 is an explanatory view illustrating a gas supply part according to an embodiment.

As illustrated in FIG. 16, a first gas supply pipe 243a, a second gas supply pipe 244a, a third gas supply pipe 245a and a cleaning gas supply pipe 248a are connected to the common gas supply pipe 242.

A first-element-containing gas (first process gas) is mainly supplied from a first gas supply part 243 including the first gas supply pipe 243a. A second-element-containing gas (second process gas) is mainly supplied from a second gas supply part 244 including the second gas supply pipe 244a. A purge gas is mainly supplied from a third gas supply part 245 including the third gas supply pipe 245a. A cleaning gas is supplied from a cleaning gas supply part 248 including the cleaning gas supply pipe 248a. A process gas supply part for supplying a process gas is configured by one or both of a first process gas supply part and a second process gas supply part. The process gas is configured by one or both of a first process gas and a second process gas.

(First Gas Supply Part)

A first gas supply source 243b, a mass flow controller (MFC) 243c as a flow rate controller (flow rate control part), and a valve 243d as an opening/closing valve are installed in the first gas supply pipe 243a in the named order from the upstream side.

A gas containing a first element (a first process gas) is supplied from the first gas supply source 243b and is supplied to the gas introduction port 241a via the MFC 243c, the valve 243d, the first gas supply pipe 243a and the common gas supply pipe 242.

The first process gas is one of precursor gases, namely one of process gases. In this regard, the first element is, for example, silicon (Si). That is to say, the first process gas is, for example, a silicon-containing gas. As the silicon-containing gas, it may be possible to use, for example, a TEOS (tetraethyl orthosilicate, $Si(OC_2H_5)_4$) gas or a $SiH_2(NH(C_4H_9))_2$(bis-tert-butylaminosilane, abbreviation: BTBAS) gas. As the silicon-containing gas, in addition to the BTBAS gas, it may be possible to use, for example, a tetrakisdimethylaminosilane ($Si[N(CH_3)_2]_4$, abbreviation: 4DMAS) gas, a bisdiethylaminosilane ($Si[N(C_2H_5)_2]_2H_2$, abbreviation: 2DEAS) gas, a hexamethyldisilazane ($C_6H_{19}NSi_2$, abbreviation: HMDS) gas, a trisilylamine (($SiH_3)_3N$, abbreviation: TSA) gas, or a hexachlorodisilane ($Si_2Cl_6$, abbreviation: HCDS) gas. A precursor of the first process gas may be any one of solid, liquid and gas under a room temperature and an atmospheric pressure. If the precursor of the first process gas is liquid under a room temperature and an atmospheric pressure, a vaporizer (not illustrated) may be installed between the first gas supply source 243b and the MFC 243c. In the present embodiment, the precursor will be described as being a gas.

A downstream end of a first inert gas supply pipe 246a is connected to the first gas supply pipe 243a at the downstream side of the valve 243d. An inert gas supply source 246b, an MFC 246c and a valve 246d as an opening/closing valve are installed in the first inert gas supply pipe 246a in the named order from the upstream side.

In this regard, the inert gas is, for example, a helium (He) gas. As the inert gas, in addition to the He gas, it may be possible to use a rare gas such as, e.g., a neon (Ne) gas or an argon (Ar) gas. In addition, the process gas may be a gas which is difficult to react with the substrate 200 or the film to be formed. For example, a nitrogen ($N_2$) gas may be used.

A first-element-containing gas supply part 243 (also referred to as a silicon-containing gas supply part) is mainly configured by the first gas supply pipe 243a, the MFC 243c and the valve 243d.

Furthermore, a first inert gas supply part is mainly configured by the first inert gas supply pipe 246a, the MFC 246c and the valve 246d. The inert gas supply source 246b and the first gas supply pipe 243a may be included in the first inert gas supply part.

In addition, the first gas supply source 243b and the first inert gas supply part may be included in the first-element-containing gas supply part.

(Second Gas Supply Part)

A second gas supply source 244b, an MFC 244c and a valve 244d as an opening/closing valve are installed in the second gas supply pipe 244a in the named order from the upstream side.

A gas containing a second element (hereinafter referred to as a "second process gas") is supplied from the second gas supply source 244b and is supplied to the gas introduction port 241a via the MFC 244c, the valve 244d, the second gas supply pipe 244a and the common gas supply pipe 242.

The second process gas is one of process gases. Furthermore, the second process gas may be considered as a reaction gas or a modifying gas.

In this regard, the second process gas contains a second element differing from the first element. The second element is, for example, one of nitrogen (N), oxygen (O), carbon (C) and hydrogen (H). As the second process gas, it may be possible to use a gas including plural kinds of elements. Specifically, an oxygen ($O_2$) gas may be used as the second process gas.

A second process gas supply part 244 is mainly configured by the second gas supply pipe 244a, the MFC 244c and the valve 244d.

In addition, a remote plasma unit (RPU) 244e as an activation part may be installed to activate the second process gas.

A downstream end of the second inert gas supply pipe 247a is connected to the second gas supply pipe 244a at the downstream side of the valve 244d. An inert gas supply source 247b, an MFC 247c and a valve 247d as an opening/closing valve are installed in the second inert gas supply pipe 247a in the named order from the upstream side.

An inert gas is supplied from the second inert gas supply source 247b to the gas introduction port 241a via the MFC 247c, the valve 247d and the second gas supply pipe 247a. The inert gas acts as a carrier gas or a dilution gas at a thin film forming step (S4001 to S4005) which will be described later.

A second inert gas supply part is mainly configured by the second inert gas supply pipe 247a, the MFC 247c and the valve 247d. The inert gas supply source 247b and the second gas supply pipe 244a may be included in the second inert gas supply part.

In addition, the second gas supply source 244b and the second inert gas supply part may be included in the second-element-containing gas supply part 244.

(Third Gas Supply Part)

A third gas supply source 245b, an MFC 245c as a flow rate controller (flow rate control part) and a valve 245d as an opening/closing valve are installed in the third gas supply pipe 245a in the named order from the upstream side.

An inert gas as a purge gas is supplied from the second gas supply source 245b and is supplied to the gas introduction port 241a via the MFC 245c, the valve 245d, the third gas supply pipe 245a and the common gas supply pipe 242.

In this regard, the inert gas is, for example, a nitrogen ($N_2$) gas. As the inert gas, in addition to the $N_2$ gas, it may be possible to use a rare gas such as, e.g., a helium (He) gas, a neon (Ne) gas or an argon (Ar) gas.

A third gas supply part 245 (also referred to as a purge gas supply part) is mainly configured by the third gas supply pipe 245a, the MFC 245c and the valve 245d.

(Cleaning Gas Supply Part)

A cleaning gas source 248b, an MFC 248c, a valve 248d and an RPU 250 are installed in the cleaning gas supply pipe 248a in the named order from the upstream side.

A cleaning gas is supplied from the cleaning gas source 248b and is supplied to the gas introduction port 241a via the MFC 248c, the valve 248d, the RPU 250, the cleaning gas supply pipe 248a and the common gas supply pipe 242.

A downstream end of a fourth inert gas supply pipe 249a is connected to the cleaning gas supply pipe 248a at the downstream side of the valve 248d. A fourth inert gas supply source 249b, an MFC 249c and a valve 249d are installed in the fourth inert gas supply pipe 249a in the named order from the upstream side.

A cleaning gas supply part is manly configured by the cleaning gas supply pipe 248a, the MFC 248c and the valve 248d. The cleaning gas source 248b, the fourth inert gas supply pipe 249a and the RPU 250 may be included in the cleaning gas supply part.

The inert gas supplied from the fourth inert gas supply source 249b may be supplied so as to act as a carrier gas or a dilution gas of the cleaning gas.

The cleaning gas supplied from the cleaning gas source 248b acts as a cleaning gas for removing byproducts adhering to the gas introduction port 241a and the process chamber 201 at the cleaning step.

In the present embodiment, the cleaning gas is, for example, a nitrogen trifluoride ($NF_3$) gas. As the cleaning gas, it may be possible to use, for example, a hydrogen fluoride (HF) gas, a chlorine trifluoride ($ClF_3$) gas, a fluorine ($F_2$) gas, or a combination thereof.

Preferably, a configuration having high responsiveness to a gas flow, such as a needle valve, an orifice or the like, may be used as the flow rate control part installed in each of the gas supply parts described above. For example, if a pulse width of a gas is of a millisecond order, there may be a case where an MFC cannot respond to a gas pulse. By combining a needle valve or an orifice with a high-speed on/off valve, it becomes possible to respond to a gas pulse of millisecond or less.

(Control Part)

Figure 17:
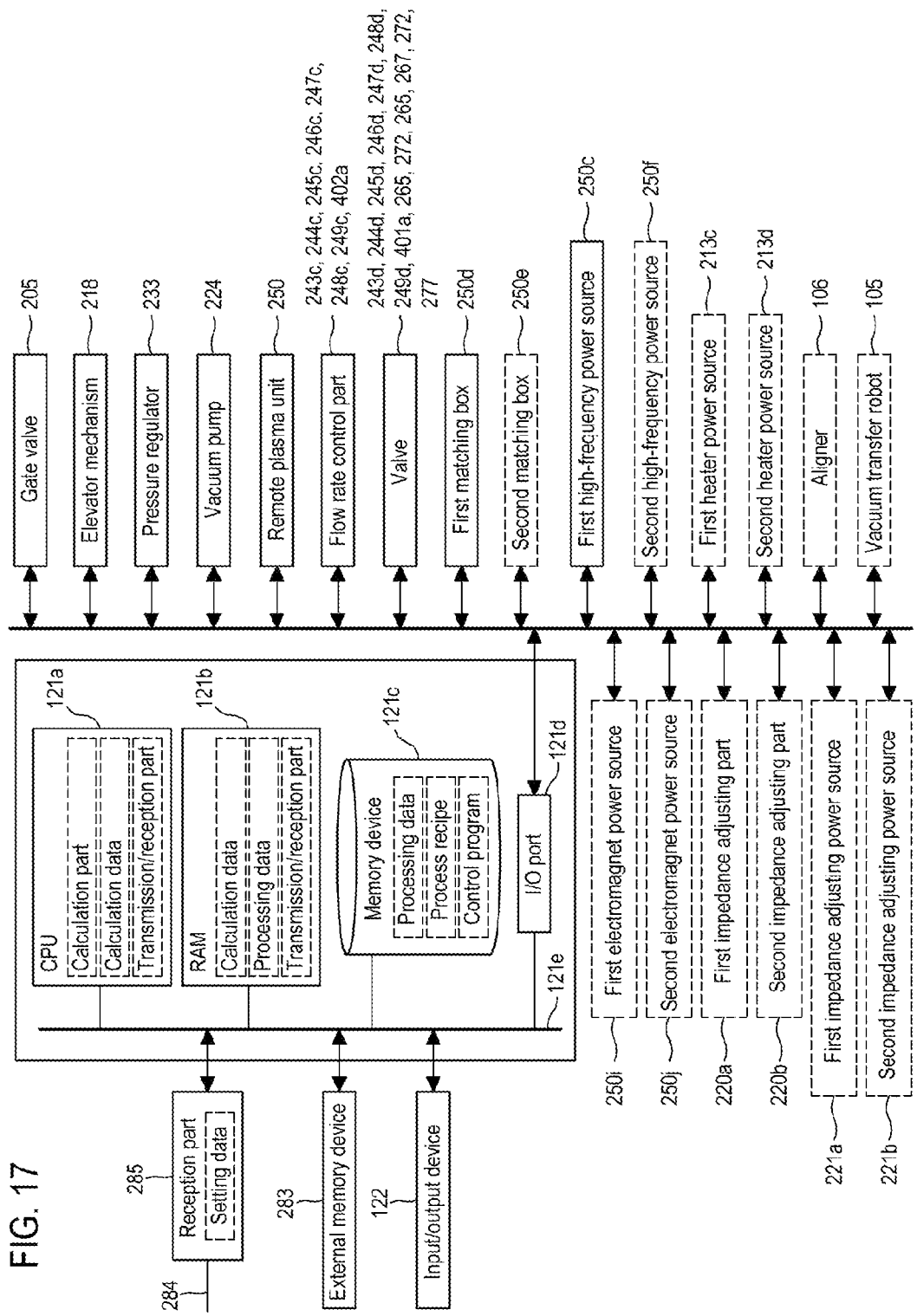
FIG. 17 is a schematic configuration view of a controller according to an embodiment.

As illustrated in FIG. 17, the substrate processing apparatus 100 includes a controller 121 that controls the operations of the respective parts of the substrate processing apparatus 100.

The controller 121 serving as a control part (control means) is configured as a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus 121e. An input/output device 122 configured as, e.g., a touch panel or the like, an external memory device 283 and a reception part 285 are connectable to the controller 121. A network 284 is connectable to the reception part 285.

The memory device 121c is configured by, for example, a flash memory, a hard disk drive (HDD), or the like. A control program for controlling the operations of the substrate processing apparatus, a process recipe in which a sequence, condition, or the like for the substrate processing described later is written, processing data used in a calculation process until the setting of the process recipe to the substrate 200, and the like are readably stored in the memory device 121c. In addition, the process recipe is a combination of sequences which causes the controller 121 to execute each sequence in a substrate processing process described later in order to obtain a predetermined result. The process recipe functions as a program. Hereinafter, the program recipe, the control program, and the like will be generally and simply referred to as a program. Furthermore, the term "program" used herein may be intended to include the program recipe alone, the control program alone, or a combination of the program recipe and the control program. Moreover, the RAM 121b is configured as a memory area (work area) in which a program read by the CPU 121a and data such as calculation data, processing data or the like are temporarily held.

Connected to the I/O port 121d are a gate valve 205, an elevator mechanism 218, a pressure regulator 223, a vacuum pump 224, an RPU 250, MFCs 243c, 244c, 245c, 246c, 247c, 248c and 249c, valves 243d, 244d, 245d, 246d, 247d, 248d and 249d, a first matching box 250d, a second matching box 250e, a first high-frequency power source 250c, a second high-frequency power source 250f, a first impedance adjusting part 220a, a second impedance adjusting part 220b, a first impedance adjusting power source 221a, a second impedance adjusting power source 221b, a first electromagnet power source 250i, a second electromagnet power source 250j, a first heater power source 213c, a second heater power source 213d, and so forth.

The CPU 121a serving as a calculation part is configured to read the control program from the memory device 121c and to execute the control program. Furthermore, the CPU 121a is configured to read the process recipe from the memory device 121c according to an operation command inputted from the input/output device 122, or the like. Moreover, the CPU 121a is configured to calculate calculation data by comparing a setting value inputted from the reception part 285 with the process recipe or the control data stored in the memory device 121c. In addition, the CPU 121a is configured to execute a process of determining corresponding processing data (process recipe) from the calculation data. Additionally, the CPU 121a is configured to control the opening/closing operation of the gate valve 205, the elevating operation of the elevator mechanism 218, the pressure regulating operation of the pressure regulator 223, the on/off operation of the vacuum pump 224, the gas excitation operation of the RPU 250, the flow rate adjusting operations of the MFCs 243c, 244c, 245c, 246c, 247c, 248c and 249c, the on/off operations of the valves 243d, 244d, 245d, 246d, 247d, 248d and 249d, the matching operations of the first matching box 250d and the second matching box 250e, the on/off operations of the first high-frequency power source 250c and the second high-frequency power source 250f, the impedance adjusting operations of the first impedance adjusting part 220a and the second impedance adjusting part 220b, the on/off operations of the first impedance adjusting power source 221a and the second impedance adjusting power source 221b, the power supply operations of the first electromagnet power source 250i and the second electromagnet power source 250j, the power supply operations of the first heater power source 213c and the second heater power source 213d, and the like, according to the contents of the read process recipe.

In addition, the controller 121 is not limited to being configured as a dedicated computer and may be configured as a general-purpose computer. For example, the controller 121 according to the present embodiment may be configured by preparing the external memory device 283 (e.g., a magnetic tape, a magnetic disc such as a flexible disc or a hard disc, an optical disc such as a compact disc (CD) or a digital versatile disc (DVD), a magneto-optical (MO) disc, or a semiconductor memory such as a universal serial bus (USB) memory or a memory card) which stores the program described above, and installing the program on the general-purpose computer using the external memory device 283. Furthermore, a means for supplying the program to the computer is not limited to the case of supplying the program through the external memory device 283. For example, the program may be supplied using a communication means such as the reception part 285, the Internet or a dedicated line without going through the external memory device 283. Moreover, the memory device 121c or the external memory device 283 is configured as a non-transitory computer-readable recording medium. Hereinafter, these will be generally and simply referred to as a recording medium. Additionally, the term "recording medium" used herein may be intended to include the memory device 121c alone, the external memory device 283 alone, or both the memory device 121c and the external memory device 283.

Figure 18:
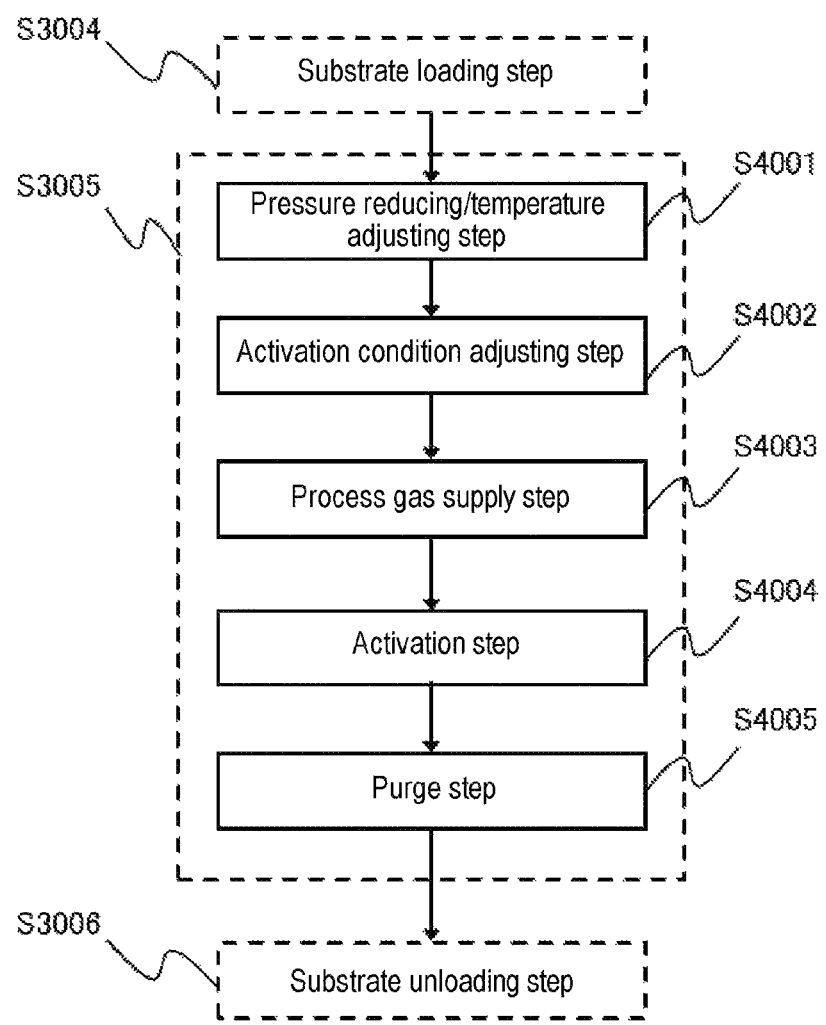
FIG. 18 is a flow chart of a substrate processing process according to an embodiment.

Next, a method of forming a film using the substrate processing apparatus 100 will be described with reference to FIGS. 18 and 19. After the film thickness measuring step S103, the measured wafer 200 is loaded into the substrate processing apparatus 100. In the following descriptions, the operations of respective parts that constitute the substrate processing apparatus are controlled by the controller 121.

(Substrate Loading Step S3004)

After the thickness of the first insulating film 2005 is measured at the film thickness measuring step S103, the wafer 200 is loaded into the substrate processing apparatus 100. Specifically, the substrate support part 210 is moved down by the elevator mechanism 218 such that the lift pins 207 protrude from the through-holes 214 toward the upper surface side of the substrate support part 210. Furthermore, after the internal pressure of the process chamber 201 is regulated to a predetermined pressure, the gate valve 205 is opened and the wafer 200 is mounted onto the lift pins 207 from the gate valve 205. After the wafer 200 is mounted onto the lift pins 207, the substrate support part 210 is moved up to a predetermined position by the elevator mechanism 218 so that the wafer 200 is transferred from the lift pins 207 to the substrate support part 210. In this regard, the predetermined pressure is set such that, for example, the internal pressure of the process chamber 201 becomes higher than or equal to the internal pressure of the vacuum transfer chamber 104.

(Pressure Reducing and Temperature Adjusting Step S4001)

Thereafter, the interior of the process chamber 201 is evacuated through the exhaust pipe 222 such that the internal pressure of the process chamber 201 reaches a predetermined pressure (vacuum degree). At this time, the opening degree of the APC valve as the pressure regulator 223 is feedback-controlled based on the pressure value measured by a pressure sensor. Furthermore, the amount of electric current supplied to the heater 213 is feedback-controlled based on the temperature value detected by a temperature sensor (not illustrated), such that the internal temperature of the process chamber 201 reaches a predetermined temperature. Specifically, the substrate support part 210 is preheated by the heater 213. After a temperature change in the wafer 200 or the substrate support part 210 disappears, the wafer 200 and the substrate support part 210 are left alone for a predetermined period of time. During this period, if moisture remains in the process chamber 201 or degassing occurs from a member, it may be removed by vacuum-exhausting or purging through the supply of a $N_2$ gas. By doing so, a preparation preceding a film forming process is completed. When evacuating the interior of the process chamber 201 to a predetermined pressure, the interior of the process chamber 201 may be first evacuated up to a reachable vacuum degree.

In this regard, it may be configured so that the temperatures of the first heater 213a and the second heater 213b can be tuned based on the received data. By tuning the temperatures of the first heater 213a and the second heater 213b so that the temperature at the center side of the substrate 200 and the temperature at the periphery side thereof differ from each other, it is possible to make different the processing at the center side of the substrate 200 and the processing at the periphery side thereof.

(Activation Condition Adjusting Step S4002)

Subsequently, at least one of adjusting (tuning) operations (A) to (C) described below is performed. FIG. 19 illustrates an example in which the adjusting (tuning) operation (A) is performed.

(A) Predetermined electric power is supplied from the first electromagnet power source 250i and the second electromagnet power source 250j to the first electromagnet 250g and the second electromagnet 250h, thereby forming a predetermined magnetic force (magnetic field) within the process chamber 201. For example, a magnetic force (magnetic field) is formed in a Z1 direction. At this time, a density of a magnetic field or a magnetic flux formed above the center or the periphery of the substrate 200 is tuned according to the received measurement data. The density of the magnetic force (magnetic field) or the magnetic flux can be tuned using the intensity of the magnetic field formed by the first electromagnet 250g and the intensity of the magnetic field formed by the second electromagnet 250h. By virtue of this tuning operation, for example, the amount of active species (the concentration of active species) introduced toward the center of the substrate 200 can be made larger (higher) than the amount of active species (the concentration of active species) introduced toward the periphery of the substrate 200. Thus, the processing amount at the center side of the substrate 200 can be made larger than the processing amount at the periphery side of the substrate 200.

In this regard, if the magnetic shielding plate 250k is installed within the process chamber 201, the height of the magnetic shielding plate 250k may be tuned. By adjusting the height of the magnetic shielding plate 250k, it is possible to tune the density of the magnetic field or the magnetic flux.

(B) The electric potentials of the first bias electrode 219a and the second bias electrode 219b are adjusted. For example, the first impedance adjusting part 220a and the second impedance adjusting part 220b are adjusted such that the electric potential of the first bias electrode 219a becomes lower than the electric potential of the second bias electrode 219b. By making the electric potential of the first bias electrode 219a lower than the electric potential of the second bias electrode 219b, the amount of active species (the concentration of active species) introduced toward the center of the substrate 200 can be made larger (higher) than the amount of active species (the concentration of active species) introduced toward the periphery of the substrate 200.

Thus, the processing amount at the center side of the substrate 200 can be made larger than the processing amount at the periphery side of the substrate 200.

(C) The setting values of the high-frequency power supplied to the first coil 250a and the second coil 250b are adjusted. For example, the setting values of the first high-frequency power source 250c and the second high-frequency power source 250f are adjusted (changed) such that the high-frequency power supplied to the first coil 250a becomes higher than the high-frequency power supplied to the second coil 250b. By making the high-frequency power supplied to the first coil 250a higher than the high-frequency power supplied to the second coil 250b, the amount of active species (the concentration of active species) introduced toward the center of the substrate 200 can be made larger (higher) than the amount of active species (the concentration of active species) introduced toward the periphery of the substrate 200. Thus, the processing amount at the center side of the substrate 200 can be made larger than the processing amount at the periphery side of the substrate 200.

(Process Gas Supply Step S4003)

Subsequently, a silicon-element-containing gas as a first process gas is supplied from the first process gas supply part into the process chamber 201. Furthermore, the internal pressure of the process chamber 201 is controlled to a predetermined pressure (first pressure) by continuously evacuating the interior of the process chamber 201 with the exhaust system. Specifically, the valve 243d of the first gas supply pipe 243a is opened to allow the silicon-element-containing gas to flow through the first gas supply pipe 243a. The flow rate of the silicon-element-containing gas is adjusted by the MFC 243c. The flow-rate-adjusted silicon-element-containing gas is supplied from the gas introduction port 241a into the process chamber 201 and is exhausted from the exhaust pipe 222. At this time, the valve 246d of the carrier gas supply pipe 246a may be opened to allow an Ar gas to flow through the first carrier gas supply pipe 246a. The flow rate of the Ar gas flowing through the first carrier gas supply pipe 246a is adjusted by the MFC 246c. The flow-rate-adjusted Ar gas is mixed with the silicon-element-containing gas within the first gas supply pipe 243a. The Ar gas is supplied from the gas introduction port 241a into the process chamber 201 and is exhausted from the exhaust pipe 222.

(Activation Step S4004)

Subsequently, an oxygen-containing gas as a second process gas is supplied from the second process gas supply part into the process chamber 201. Furthermore, the internal pressure of the process chamber 201 is controlled to a predetermined pressure by continuously evacuating the interior of the process chamber 201 with the exhaust system. Specifically, the valve 244d of the second gas supply pipe 244a is opened to allow the oxygen-containing gas to flow through the second gas supply pipe 244a. The flow rate of the oxygen-containing gas is adjusted by the MFC 244c. The flow-rate-adjusted oxygen-containing gas is supplied from the gas introduction port 241a into the process chamber 201 and is exhausted from the exhaust pipe 222. At this time, if high-frequency power is supplied from the first high-frequency power source 250c to the first coil 250a via the first matching box 250d, the oxygen-containing gas existing within the process chamber 201 is activated. At this time, particularly, oxygen-containing plasma is generated in at least one of the first plasma generating region 251, the third plasma generating region 253 and the fourth plasma generating region 254. The activated oxygen is supplied to the substrate 200. Preferably, it may be configured so that active species are supplied to the center and the periphery of the substrate 200 at different concentrations. For example, by making the magnitude of the magnetic field formed by the second electromagnet 250h larger than the magnitude of the magnetic field formed by the first electromagnet 250g, the plasma density at the periphery side of the fourth plasma generating region 254 can be made higher than the plasma density at the center side thereof. In this case, it is possible to generate a larger amount of active plasma above the periphery of the substrate 200 than above the center of the substrate 200.

The substrate is maintained for a predetermined time period in the state in which the oxygen-containing plasma is generated, thereby subjecting the substrate to a predetermined process.

Furthermore, the concentrations of active species at the center side and the periphery side of the substrate may be made different by the difference between the electric potentials of the first bias electrode 219a and the second bias electrode 219b.

At this time, high-frequency power may be supplied from the second high-frequency power source 250f to the second coil 250b via the second matching box 250e, thereby generating oxygen-containing plasma in the second plasma generating region 252.

(Purge Step S4005)

After a predetermined time period is elapsed in the state in which the oxygen-containing plasma is generated, the high-frequency power is turned off to extinguish the plasma. At this time, the supply of the silicon-element-containing gas and the supply of the oxygen-containing gas may be stopped or may be continuously performed for a predetermined time period. After stopping the supply of the silicon-element-containing gas and the supply of the oxygen-containing gas, the gas remaining within the process chamber 201 is exhausted by the exhaust part. At this time, an inert gas may be supplied from the inert gas supply part into the process chamber 201 so as to extrude the residual gas. With this configuration, it is possible to shorten the time required for the purge step and to improve the throughput.

(Substrate Unloading Step S3006)

After the purge step S4005 is performed, a substrate unloading step S3006 is performed to unload the wafer 200 from the process chamber 201. Specifically, the interior of the process chamber 201 is purged by an inert gas. The internal pressure of the process chamber 201 is regulated to a pressure at which the wafer 200 can be transferred. After the pressure regulation, the substrate support part 210 is moved down by the elevator mechanism 218. The lift pins 207 protrude from the through-holes 214. The wafer 200 is placed on the lift pins 207. After the wafer 200 is placed on the lift pins 207, the gate valve 205 is opened and the wafer 200 is unloaded from the process chamber 201.

Subsequently, a method of controlling the thickness of the second insulating film using this apparatus will be described. As described above, after the polishing step S102 is completed, the first interlayer insulating film 2005 has different film thicknesses in the central surface and the peripheral surface of the wafer 200. At the film thickness measuring step S103, the film thickness distribution is measured. The measurement result is stored in the RAM 121b through a host device (not illustrated). The stored data are compared with a recipe stored in the memory device 121c. Predetermined processing data are calculated by the CPU 121a. The apparatus is controlled based on the processing data.

Subsequently, descriptions will be made on a case where the data stored in the RAM 121b have distribution A. The case of distribution A refers to a case where the insulating film 2005a is thicker than the insulating film 2005b as illustrated in FIG. 8.

In the case of distribution A, at this step, control is executed so that the thickness of the second insulating film formed on the peripheral surface of the wafer 200 becomes large and so that the thickness of the second insulating film formed on the central surface of the wafer 200 becomes small. For example, by making the magnetic force generated from the second electromagnet 250h larger than the magnetic force generated from the first electromagnet 250g, the plasma density in the fourth plasma generating region 254 can be made higher than the plasma density in the third plasma generating region 253. It is therefore possible to generate a larger amount of active plasma above the periphery of the substrate 200 than above the center of the substrate 200. By processing the substrate 200 in the state in which the plasma is generated, the height of the insulating film 2005 and the insulating film 2007 overlapped with each other can be corrected like target film thickness distribution A' illustrated in FIG. 10. That is to say, the thickness of the laminated insulating film can be corrected like film thickness distribution A'.

At this time, the thickness of the insulating film 2006 is controlled such that the thickness of the insulating film 2005b and the insulating film 2006b overlapped with each other becomes substantially equal to the thickness of the insulating film 2005a and the insulating film 2006a overlapped with each other. Preferably, the thickness of the insulating film 2006 is controlled such that the distance from the substrate surface to the upper end of the second interlayer insulating film falls within a predetermined range. More preferably, the film thickness distribution of the second interlayer insulating film is controlled such that the distribution of the height of the second interlayer insulating film (the upper end of the second interlayer insulating film) in the substrate plane falls within a predetermined range.

As another method, the electric potential of the first bias electrode 219a and the electric potential of the second bias electrode 219b may be respectively controlled. For example, by making the electric potential of the second bias electrode 219b lower than the electric potential of the first bias electrode 219a, it is possible to increase the amount of active species introduced toward the periphery of the wafer 200 and to increase the film thickness at the periphery side of the wafer 200.

Furthermore, the electric power supplied to the first coil 250a and the electric power supplied to the second coil 250b may be respectively controlled. For example, by making the electric power supplied to the second coil 250b larger than the electric power supplied to the first coil 250a, it is possible to increase the amount of active species supplied toward the periphery of the wafer 200 and to increase the film thickness at the periphery side of the wafer 200.

In addition, by performing the plural kinds of control in parallel, it is possible to perform more accurate control.

In the case of distribution B, at this step, control is executed so that the thickness of the insulating film 2007a formed on the central surface of the wafer 200 becomes large and so that the thickness of the insulating film 2007b formed on the peripheral surface of the wafer 200 becomes small. For example, control is executed so that the magnetic force generated from the first electromagnet 250g becomes larger than the magnetic force generated from the second electromagnet 250h and so that plasma is generated at the side of the third plasma generating region 253. By doing so, the height of the insulating films, namely the height of the insulating film 2005 and the insulating film 2007 overlapped with each other, can be corrected like film thickness distribution B' illustrated in FIG. 12. That is to say, the thickness of the laminated insulating film can be corrected like film thickness distribution B'.

At this time, the thickness of the insulating film 2007 is controlled such that the thickness of the insulating film 2005b and the insulating film 2006b overlapped with each other becomes substantially equal to the thickness of the insulating film 2005a and the insulating film 2006a overlapped with each other.

As another method, the electric potential of the first bias electrode 219a and the electric potential of the second bias electrode 219b may be respectively controlled. For example, by making the electric potential of the first bias electrode 219a lower than the electric potential of the second bias electrode 219b, it is possible to increase the amount of active species introduced toward the center of the substrate 200 and to increase the film thickness at the center side of the substrate 200.

Furthermore, the electric power supplied to the first coil 250a and the electric power supplied to the second coil 250b may be respectively controlled. For example, by making the electric power supplied to the first coil 250a larger than the electric power supplied to the second coil 250b, it is possible to increase the amount of active species supplied toward the center of the substrate 200 and to increase the film thickness at the center side of the substrate 200.

In addition, by performing the plural kinds of control in parallel, it is possible to perform more accurate control.

(Film Thickness Measuring Step S105)

Subsequently, a film thickness measuring step S105 will be described. At the film thickness measuring step S105, the height of an overlapped layer of the first insulating film 2005 and the second insulating film 2007 is measured. Specifically, it is checked whether the heights of the overlapped layer are aligned with one another, namely whether the thickness of the laminated insulating film is corrected like a target film thickness distribution. The expression "heights are aligned" used herein is not limited to a case where heights are completely identical with one another but may refer to a case where a height difference exists. For example, the height difference may fall within a range that does not affect a patterning step or a metal film forming step which will be described later. If the height distribution in the plane of the wafer 200 falls within a predetermined range, the flow proceeds to a nitride film forming step S107. In the case where it is previously known that the film thickness distribution is a predetermined distribution, the film thickness measuring step S105 may be omitted.

(Nitride Film Forming Step S107).

Next, a nitride film forming step S107 will be described. After the second interlayer insulating film forming step S104 or after the film thickness measuring step S105, the wafer 200 is loaded into a nitride film forming apparatus 100d. The nitride film forming apparatus 100d is a typical single-substrate-type apparatus. Thus, descriptions thereof will be omitted.

Figures 20A, 20B:
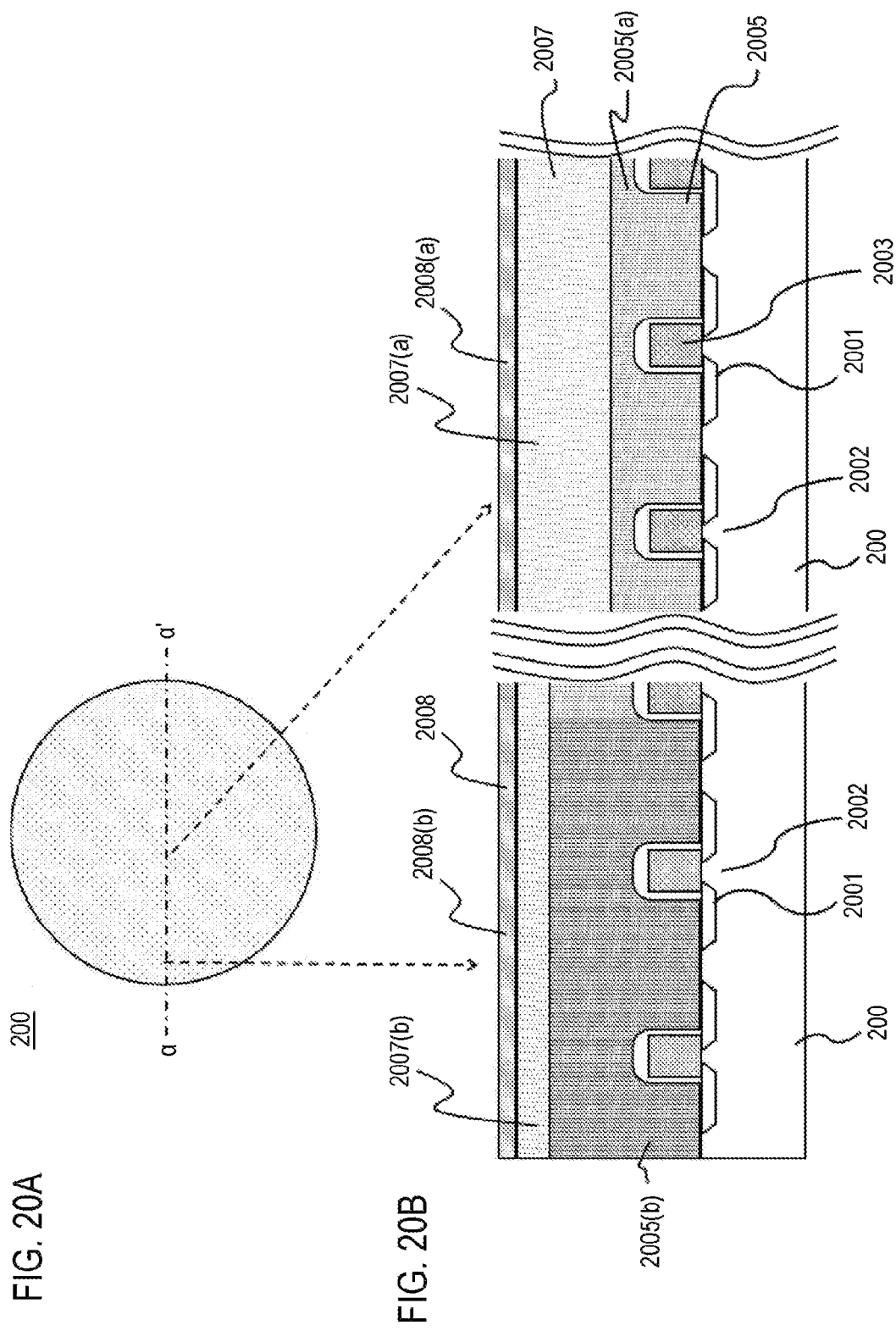
FIGS. 20A and 20B are explanatory views illustrating a processing state of a wafer according to an embodiment.

At this step, as illustrated in FIGS. 20A and 20B, a silicon nitride film 2008 is formed on the second insulating film 2007. The silicon nitride film serves as a hard mask during an etching process of a patterning step which will be described later. In FIGS. 20A and 20B, distribution A is illustrated as an example. However, the present disclosure is not limited thereto. It goes without saying that the present disclosure is equally applicable to distribution B.

In the nitride film forming apparatus, a silicon-containing gas and a nitrogen-containing gas are supplied into the process chamber to form the silicon nitride film 2008 on the wafer 200. The silicon-containing gas is, for example, a disilane ($Si_2H_4$) gas. The nitrogen-containing gas is, for example, an ammonia ($NH_3$) gas.

Since the silicon nitride film 2008 is formed on the insulating film 2007 whose heights are aligned at the second insulating film forming step S104, the heights of the silicon nitride film 2008 also have a height distribution falling within a predetermined range in the substrate plane. That is to say, in the wafer plane, the distance from the wafer surface 200a to the surface of the silicon nitride film 2008 falls within a predetermined range in the wafer plane.

(Film Thickness Measuring Step S108)

Subsequently, a film thickness measuring step S108 will be described. At the film thickness measuring step S108, the height of the overlapping layer of the first insulating film, the second insulating film and the silicon nitride film is measured. If the height of the overlapping layer falls within a predetermined range, the flow proceeds to a patterning step S109. The term "predetermined range" used herein refers to a range that does not affect an etching step or a metal film forming step which will be described later. In the case where it is previously known that the height of the overlapping layer of the first insulating film, the second insulating film and the silicon nitride film falls within a predetermined range, the film thickness measuring step S108 may be omitted.

(Patterning Step S109)

Figures 21A, 21B:
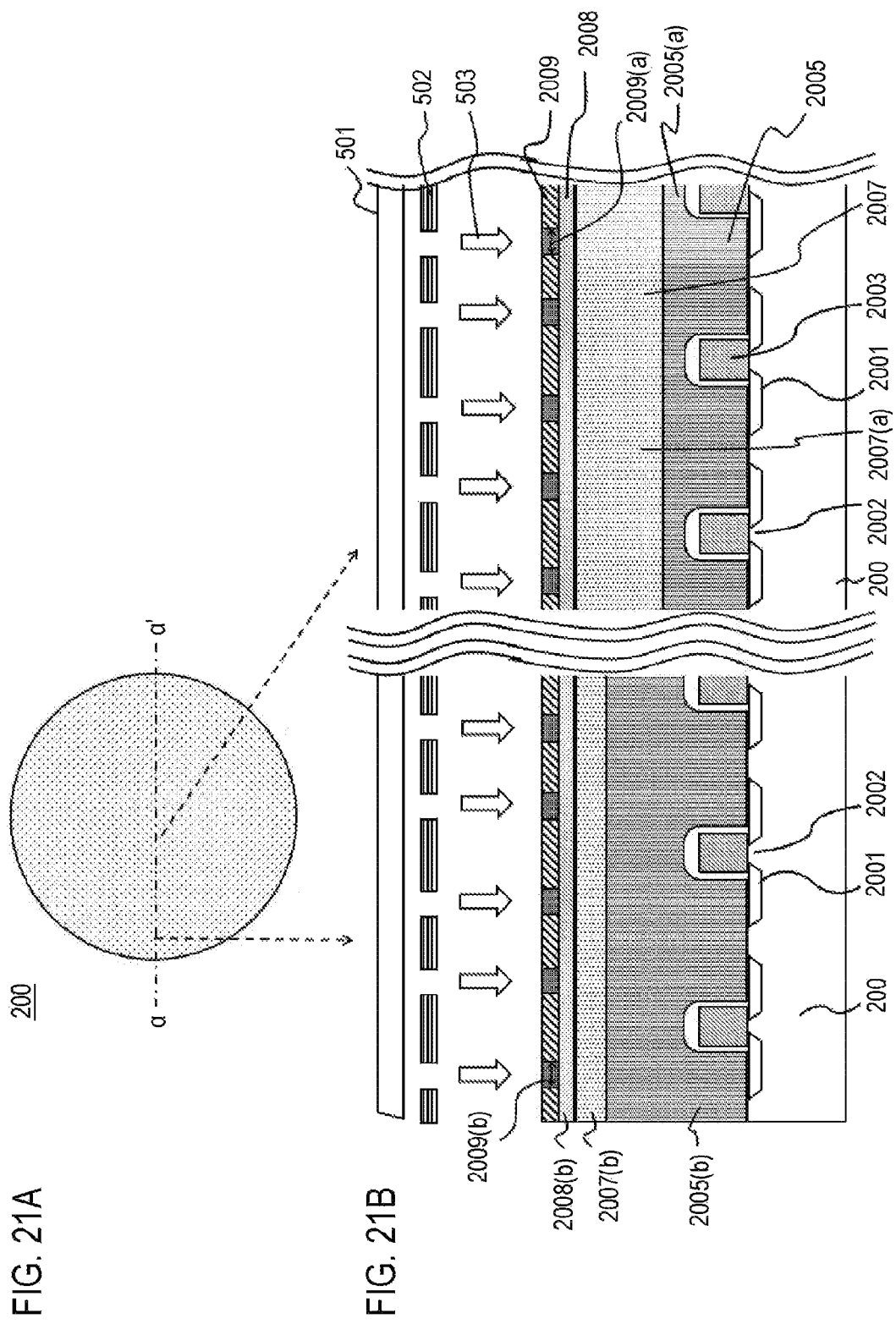
FIGS. 21A and 21B are explanatory views illustrating a processing state of a wafer according to an embodiment.
Figure 22A:
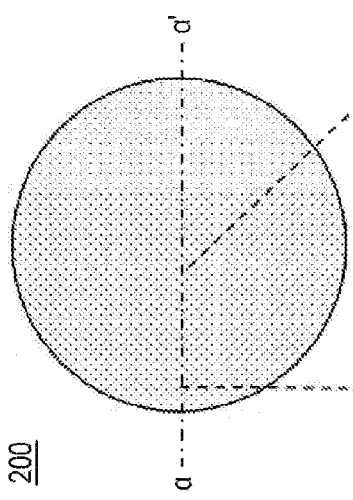
FIGS. 22A and 22B are explanatory views illustrating a processing state of a wafer according to an embodiment.
Figure 22B:
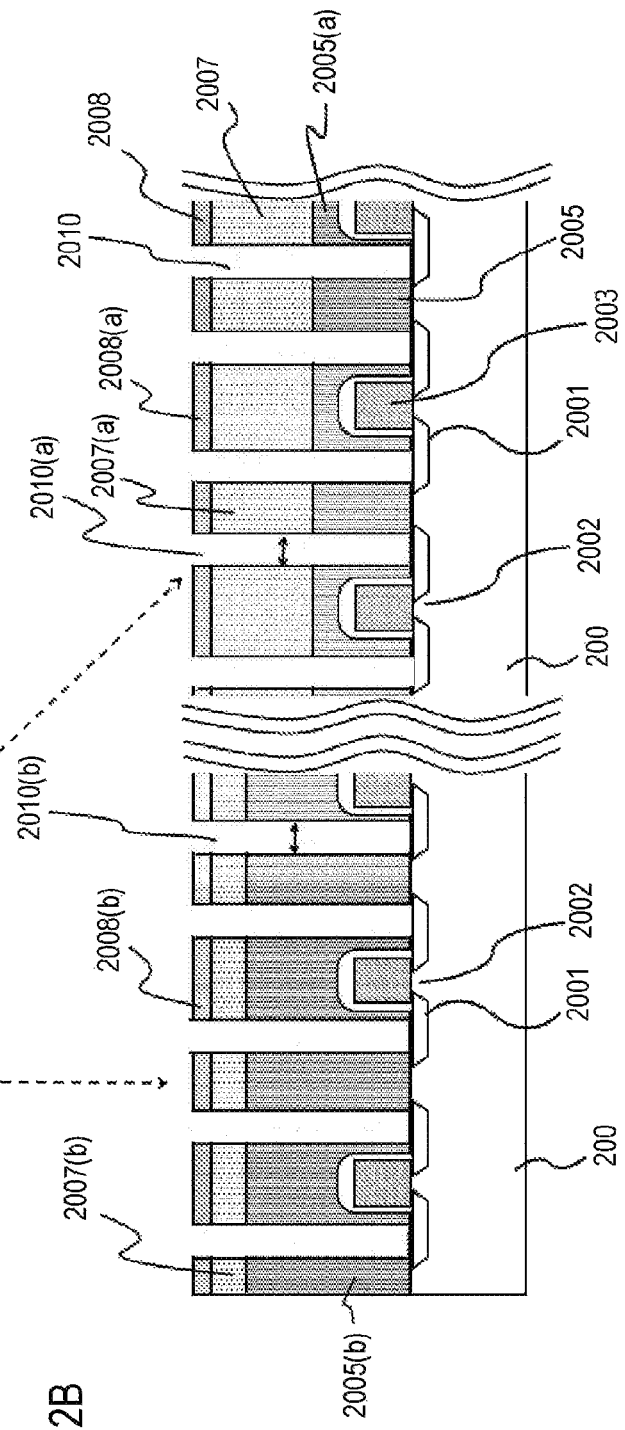

Subsequently, a patterning step S109 will be described. FIGS. 21A and 21B are explanatory views illustrating the wafer 200 during an exposure process. FIGS. 22A and 22B are explanatory views illustrating the wafer 200 after an etching process.

Hereinafter, details of the patterning step S109 will be described. After the silicon nitride film is formed, a resist film 2009 is coated on the silicon nitride film in a resist forming apparatus. Thereafter, as illustrated in FIGS. 22A and 22B, an exposure process is performed by emitting light from a lamp 501. In the exposure process, light 503 is irradiated onto the resist film 2009 through a mask 502 to reform a portion of the resist film 2009. In this regard, the reformed resist film existing on the central surface of the wafer 200 will be referred to as a resist film 2009a and the reformed resist film existing on the peripheral surface of the wafer 200 will be referred to as a resist film 2009b.

As described above, the height distribution from the wafer surface 200a to the surface of the silicon nitride film 2008 falls within a predetermined range in the substrate plane. Thus, the heights from the wafer surface 200a to the surface of the resist film 2009 can be aligned. During the exposure process, the distance from the lamp 501 to the resist film 2009, namely the moving distance of the light 503, is made uniform in the wafer plane. It is therefore possible to make uniform the in-plane distribution of a depth of focus.

Since the depth of focus can be made uniform, it is possible to make uniform the width of the resist film 2009a and the resist film 2009b in the substrate plane. This makes it possible to eliminate a variation in the pattern width.

Subsequently, a state of the wafer 200 after the etching process will be described with reference to FIGS. 22A and 22B. As described above, the width of the resist film 2009a and the resist film 2009b falls within a predetermined range. It is therefore possible to make uniform an etching condition in the plane of the wafer 200. Thus, an etching gas can be uniformly supplied to the central surface and the peripheral surface of the wafer 200. It is therefore possible to make uniform the widths of etched grooves 2010, namely the width of a groove 2010a existing on the central surface of the wafer 200 and the width of a groove 1010b existing on the peripheral surface thereof. Since the widths of the grooves 2010 are made uniform in the wafer plane, it is possible to make uniform the characteristics of a circuit in the substrate plane and to improve the yield rate.

(First Metal Film Forming Step 110)

Figure 23A:
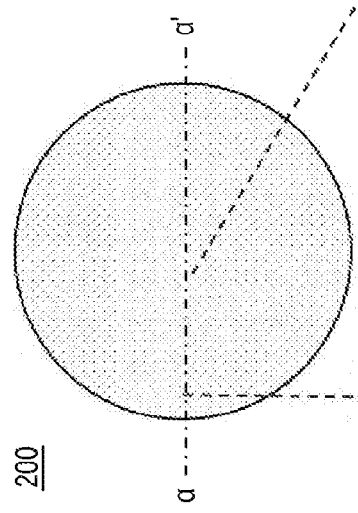
FIGS. 23A and 23B are explanatory views illustrating a processing state of a wafer according to an embodiment.
Figure 23B:
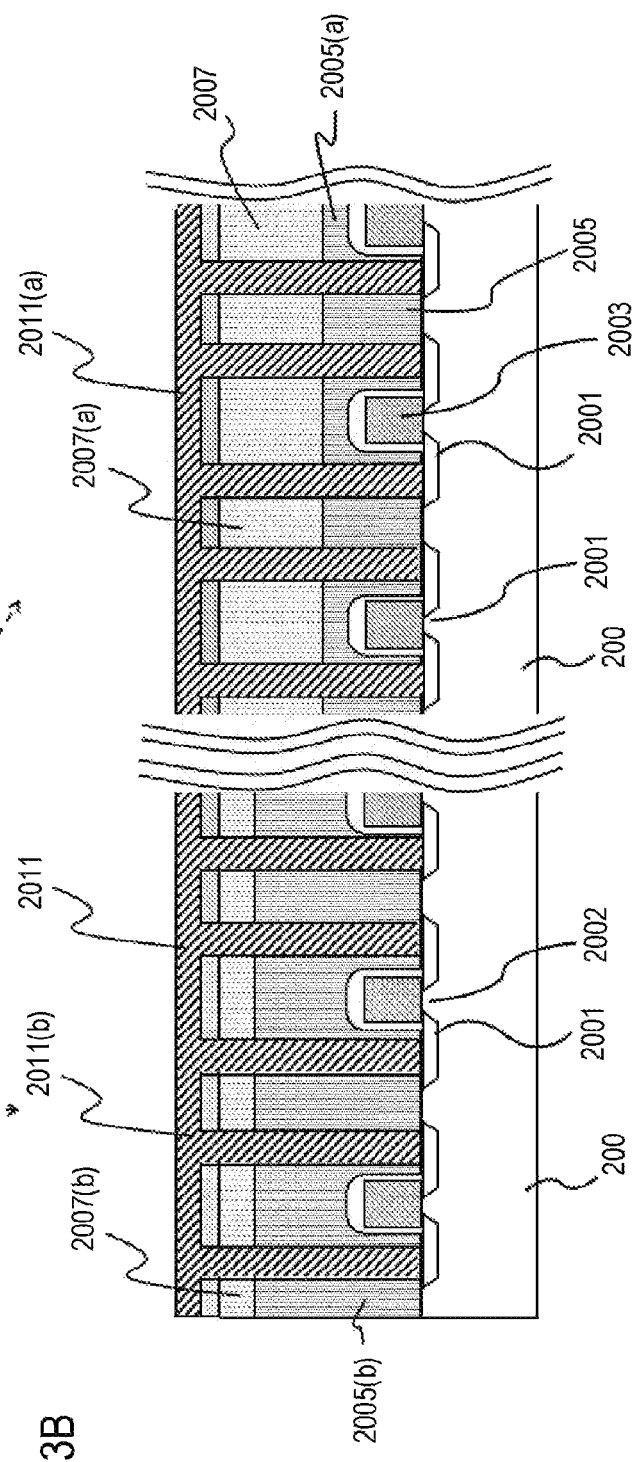

Subsequently, a first metal film forming step S110 will be described. FIGS. 23A and 23B are views illustrating the wafer 200 on which a metal film 2011 as a first metal film is formed. A metal film forming apparatus is a thin film forming apparatus such as an existing CVD apparatus or the like. Thus, descriptions thereof will be omitted.

After the etching process is finished, the wafer 200 is loaded into the metal film forming apparatus. A metal-containing gas is supplied into the process chamber of the metal film forming apparatus to form the metal film 2011. A metal has a conductive property. For example, tungsten (W) is used as the metal.

The metal-containing gas is supplied to the grooves 2010 or the like, thereby filling a metal component into the grooves 2010 as illustrated in FIGS. 23A and 23B. The filled metal is used as a conductive wiring line to be connected to a circuit formed in an upper layer.

(Metal Film Polishing Step S111)

After the metal is filled, the wafer 200 is unloaded from the metal film forming apparatus and is then transferred to a polishing apparatus. An extra metal film is polished by the polishing apparatus. The extra metal film refers to, e.g., a film protruding from the grooves 2010.

(Second Metal Film Forming Step S112)

Figure 24A:
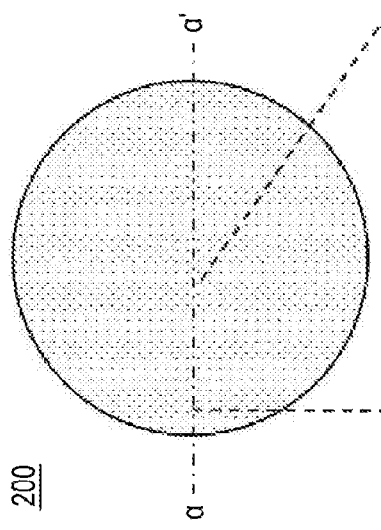
FIGS. 24A and 24B are explanatory views illustrating a processing state of a wafer according to an embodiment.
Figure 24B:
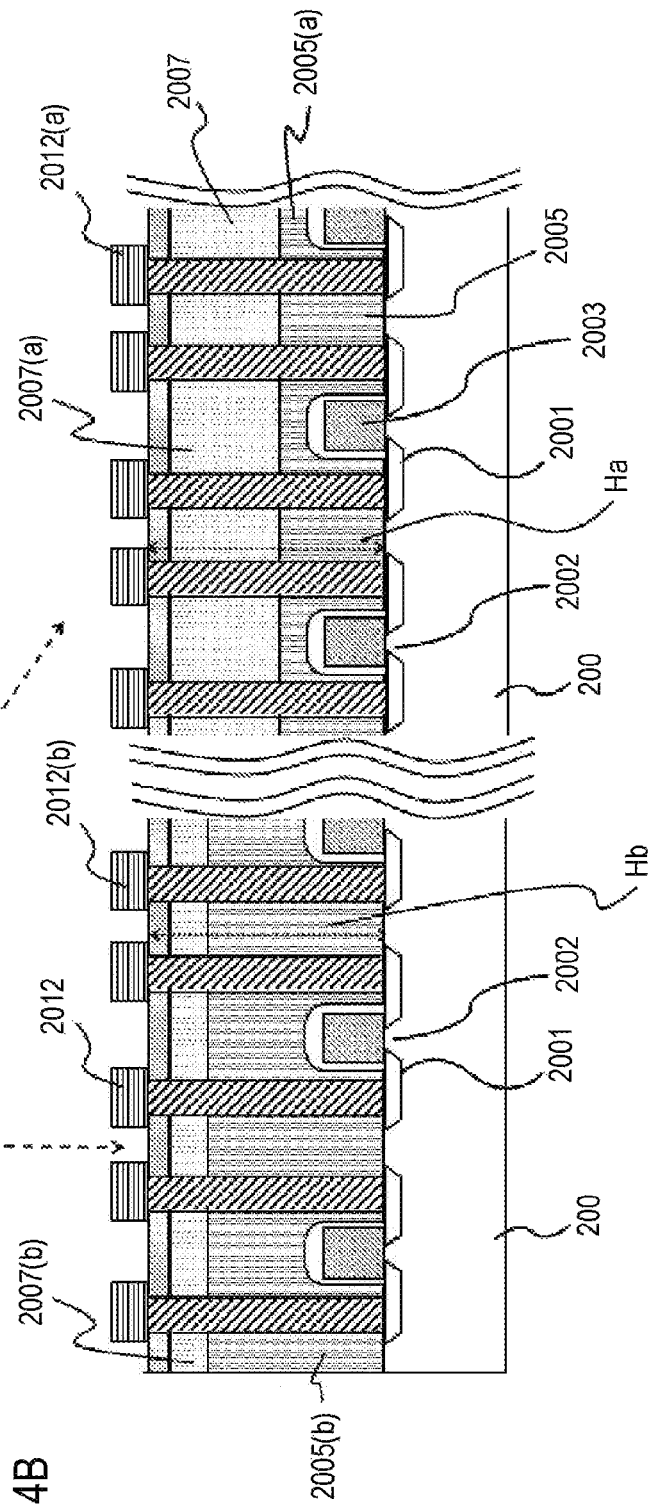

After the metal film polishing step S111, a second metal film 2012 is formed on the first metal film 2011 through a film forming process and a patterning process as illustrated in FIGS. 24A and 24B. The second metal film 2012 may be identical in composition with the first metal film 2011 or may differ in composition from that of the first metal film 2011 depending on the characteristics of a circuit.

As described above, by performing the substrate processing step including the second interlayer insulating film forming step S104, the heights of the first metal film 2011 extending from the substrate surface 200a can be aligned on the central surface and the peripheral surface of the wafer 200. Accordingly, the characteristics of the first metal film 2011 that interconnects the source/drain regions 2001 and the second metal film 2012 can be made uniform in the wafer plane. That is to say, it is possible to make uniform the characteristics of many semiconductor devices manufactured from the wafer 200.

The term "characteristics" used herein refers to, for example, an electrical capacity.

While the conductive wiring line disposed between the source/drain regions 2001 and the second metal film 2012 has been described as an example in the present embodiment, the present disclosure is not limited thereto. For example, the source/drain regions may be replaced by metal wiring lines. In this case, one of the metal wiring lines may be a first metal wiring line and the other metal wiring line may be a second metal wiring line disposed in a layer above the first metal wiring line. The conductive layer according to the present embodiment may be disposed between the first metal wiring line and the second metal wiring line.

While the connection of gravity-direction upper and lower layers has been described as an example in the present embodiment, the present disclosure is not limited thereto.

Needless to say, the present disclosure may be applied to, for example, a three-dimensional laminated circuit.

Subsequently, comparative examples will be described with reference to FIGS. 25A to 27B. The comparative examples are directed to the cases where the second interlayer insulating film forming step S104 is not performed. Thus, the heights in the central surface and the peripheral surface of the wafer 200 differ from each other.

Figure 25A:
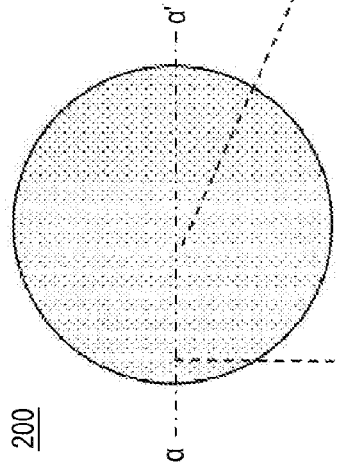
FIGS. 25A and 25B are explanatory views illustrating a processing state of a wafer according to a comparative example.
Figure 25B:
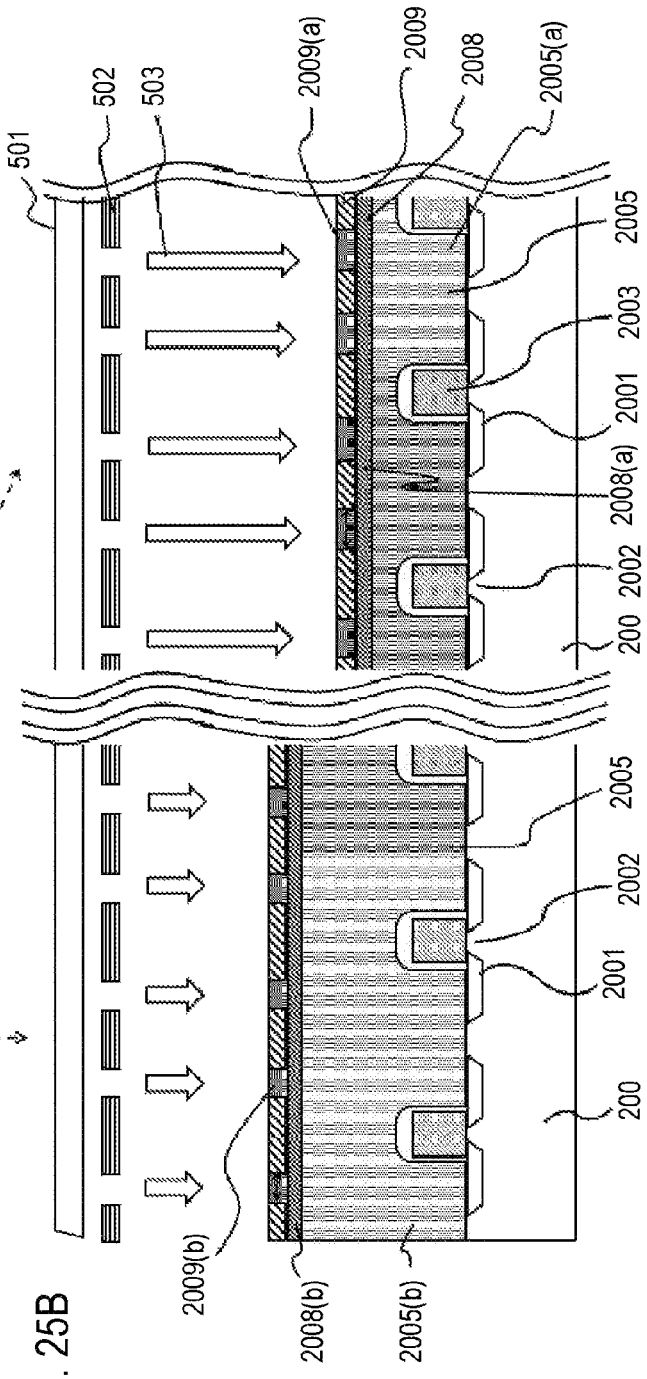
Figures 26A, 26B:
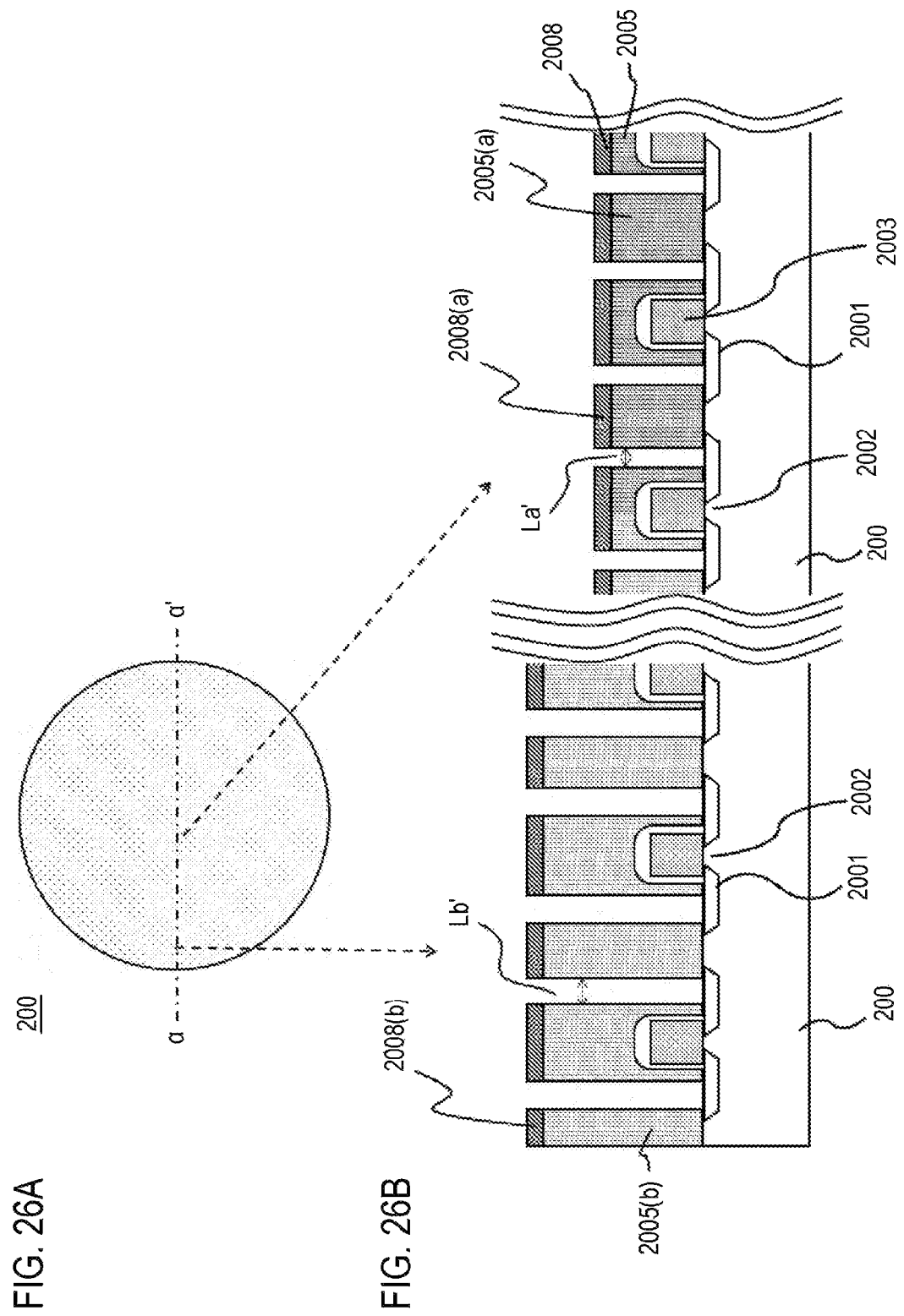
FIGS. 26A and 26B are explanatory views illustrating a processing state of a wafer according to a comparative example.

First, a first comparative example will be described with reference to FIGS. 25A and 25B. FIGS. 25A and 25B are views for comparison with FIGS. 21A and 21B. In FIGS. 25A and 25B, the heights of the insulating film 2005 are different on the central surface and the peripheral surface of the wafer 200. That is to say, the heights of the insulating film 2005a and the insulating film 2005b differ from each other. Thus, the moving distances of light 503 differ on the central surface of the wafer 200 and the peripheral surface thereof. Accordingly, the focal lengths differ on the central surface and the peripheral surface of the wafer 200. As a result, the width of the resist film 2009a and the width of the resist film 2009b differ from each other. If a process is performed with this resist film 2009, the width La' of the grooves on the central surface of the wafer 200 become different from the width Lb' of the grooves on the peripheral surface of the wafer 200 as illustrated in FIGS. 26A and 26B. Consequently, a variation in the characteristics of a semiconductor device occurs on the central surface of the wafer 200 and the peripheral surface thereof.

In contrast, in the present embodiment, the second insulating film forming step S104 is performed. It is therefore possible to make uniform the width of the grooves 2010 in the wafer plane. Thus, compared with the comparative example, it is possible to form a semiconductor device having uniform characteristics, thereby significantly contributing to the improvement of a yield rate.

Subsequently, a second comparative example will be described. FIGS. 27A and 27B are views for comparison with FIGS. 24A and 24B. FIGS. 27A and 27B assume a case where there is no variation in the width of the resist film 2009a and the resist film 2009b.

As described above, the first metal film forming step S110, the metal film polishing step S111 and the second metal film forming step S112 are performed after the patterning step, thereby forming the first metal film 2011 and the second metal film 2012.

However, the insulating film 2005 has different thicknesses on the central surface and the peripheral surface of the wafer 200. That is to say, the heights of the insulating film 2005a and the insulating film 2005b differ from each other. Therefore, as illustrated in FIGS. 27A and 27B, the height Ha' of the overlapped layer of the insulating film 2005a and the silicon nitride film 2008a on the central surface of the wafer 200 and the height Hb' of the overlapped layer of the insulating film 2005b and the silicon nitride film 2008b on the peripheral surface of the wafer 200 become different from each other.

As described above, it is known that the electrical capacity of the first metal film 2011 depends on the height thereof. That is to say, under the circumstance illustrated in FIGS. 23A and 23B, the electrical capacity become different on the central surface of the wafer 200 and the peripheral surface of the wafer 200.

In contrast, in the present embodiment, the second insulating film forming step S104 is performed. It is therefore possible to make uniform the heights of the first metal film in the wafer plane. Thus, compared with the comparative example, it is possible to form a semiconductor device having uniform characteristics, thereby significantly contributing to the improvement of a yield rate.

While descriptions have been made by dividing the wafer 200 into the central surface and the peripheral surface, the present disclosure is not limited thereto. The thickness of the insulating film may be controlled in radially subdivided regions. For example, the wafer 200 may be divided into three regions such as a central surface, a peripheral surface and a surface between the central surface and the peripheral surface.

While the silicon nitride film has been described as an example of the hard mask, the present disclosure is not limited thereto. The hard mask may be, for example, a silicon oxide film.

Other Embodiments

Figure 19:
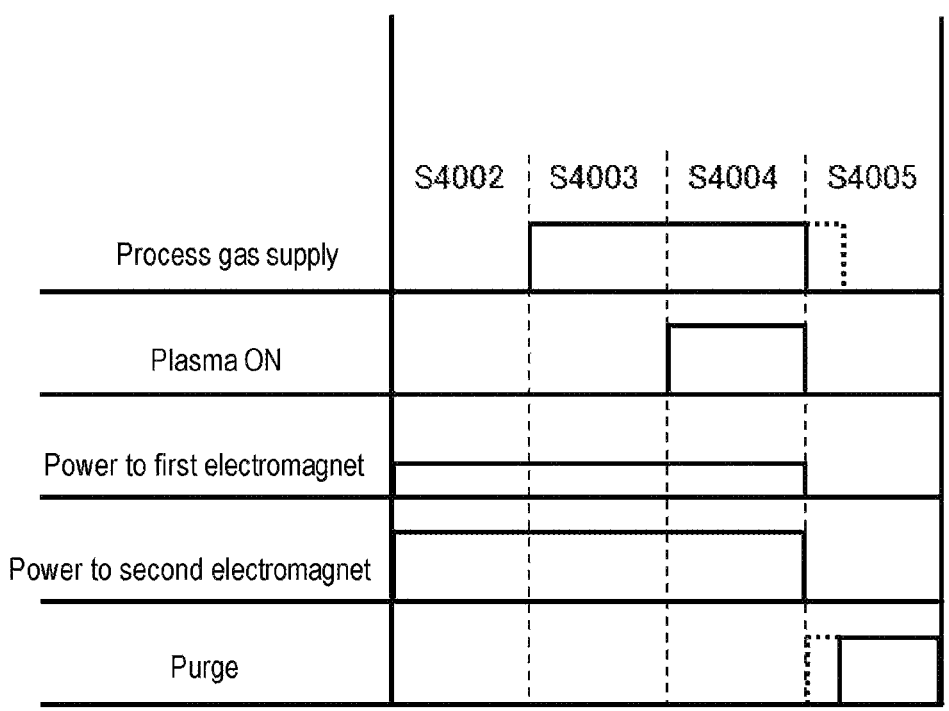
FIG. 19 illustrates a substrate processing sequence example according to an embodiment.

The present disclosure is not limited to the process sequence example illustrated in FIG. 19 in which a difference is generated between the deposition amount at the center side of the wafer 200 and the deposition amount at the periphery side of the wafer 200. The following process sequence examples are available.

Figure 28:
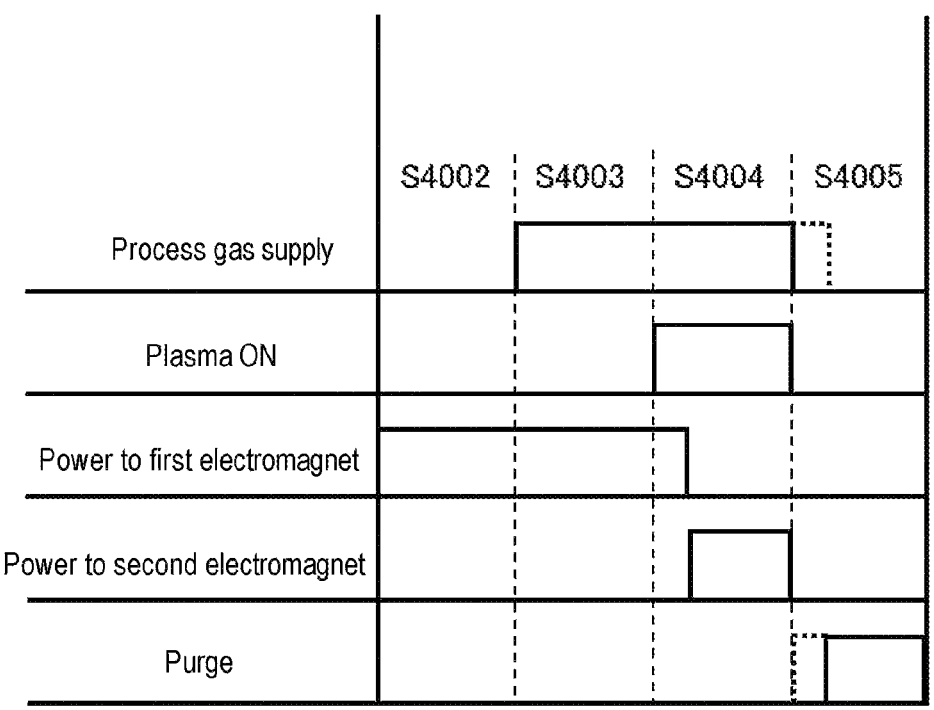
FIG. 28 illustrates a substrate processing sequence example according to another embodiment.

For example, there is available a process sequence example illustrated in FIG. 28. FIG. 28 illustrates an example in which a process is performed by forming a magnetic field with the second electromagnet 250h after forming a magnetic field with the first electromagnet 250g. By performing the process in this way, the deposition amount at the periphery side of the substrate can be made larger than the deposition amount at the center side of the substrate. Conversely, if it is configured so that a magnetic field is formed by the first electromagnet 250g after forming a magnetic field by the second electromagnet 250h, the deposition amount at the center side of the substrate can be made larger than the deposition amount at the periphery side of the substrate.

Figure 29:
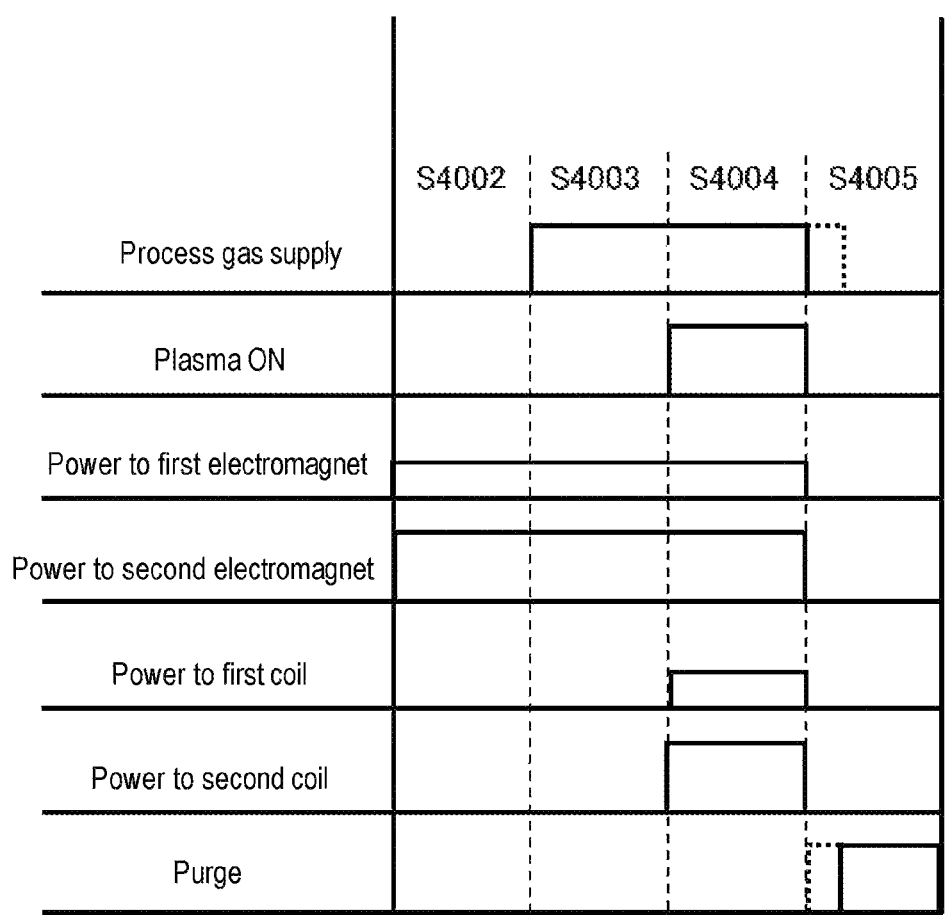
FIG. 29 illustrates a substrate processing sequence example according to another embodiment.

Furthermore, there is available a process sequence example illustrated in FIG. 29. FIG. 29 illustrates an example in which a process is performed by making the electric power supplied to the second coil 250b higher than the electric power supplied to the first coil 250a in the process sequence illustrated in FIG. 19. By performing the process in this way, the deposition amount at the periphery side of the substrate can be made larger than the deposition amount at the center side of the substrate. Conversely, by making the electric power supplied to the first electromagnet 250g higher than the electric power supplied to the second electromagnet 250h and making the electric power supplied to the first coil 250a higher than the electric power supplied to the second coil 250b, the deposition amount at the center side of the substrate can be made larger than the deposition amount at the periphery side of the substrate.

Figure 30:
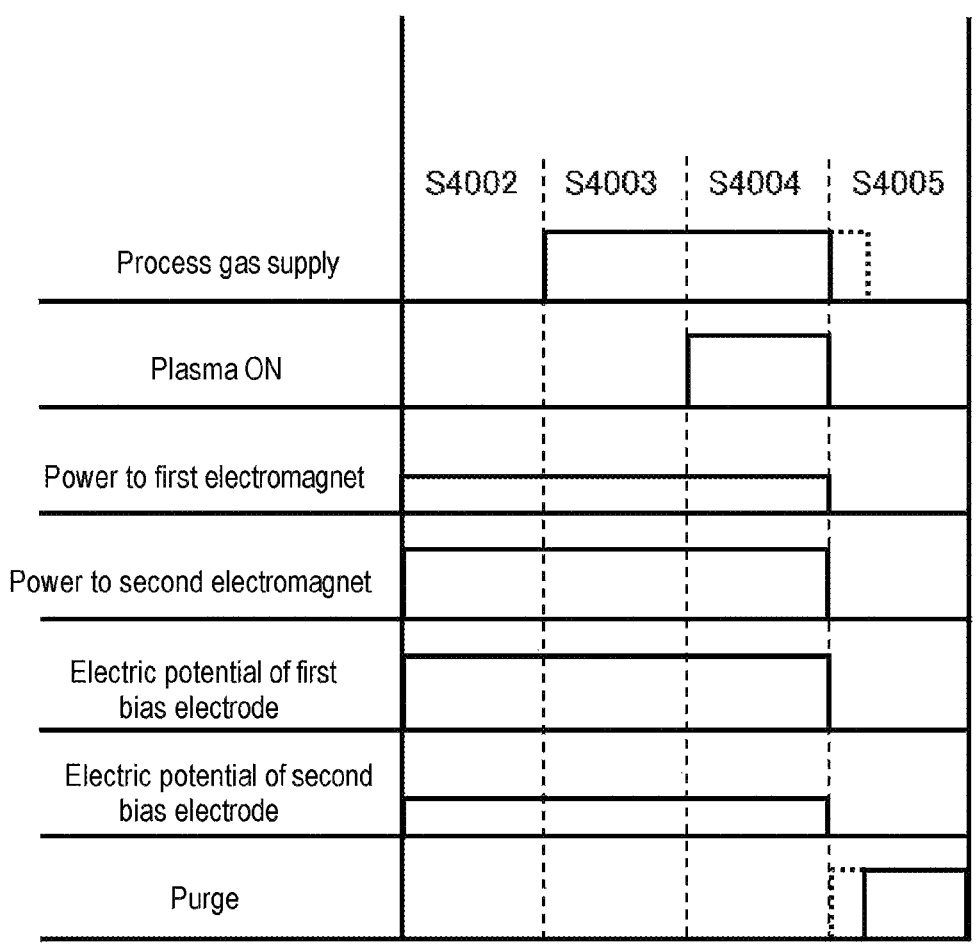
FIG. 30 illustrates a substrate processing sequence example according to another embodiment.

Furthermore, there is available a process sequence example illustrated in FIG. 30. FIG. 30 illustrates an example in which a process is performed by making the electric potential of the first bias electrode 219a higher than the electric potential of the second bias electrode 219b in the process sequence illustrated in FIG. 19. By performing the process in this way, the deposition amount at the periphery side of the substrate can be made larger than the deposition amount at the center side of the substrate. Conversely, by making the electric power supplied to the first electromagnet 250g higher than the electric power supplied to the second electromagnet 250h and making the electric potential of the second bias electrode 219b higher than the electric potential of the first bias electrode 219a, the deposition amount at the center side of the substrate can be made larger than the deposition amount at the periphery side of the substrate.

Figure 31:
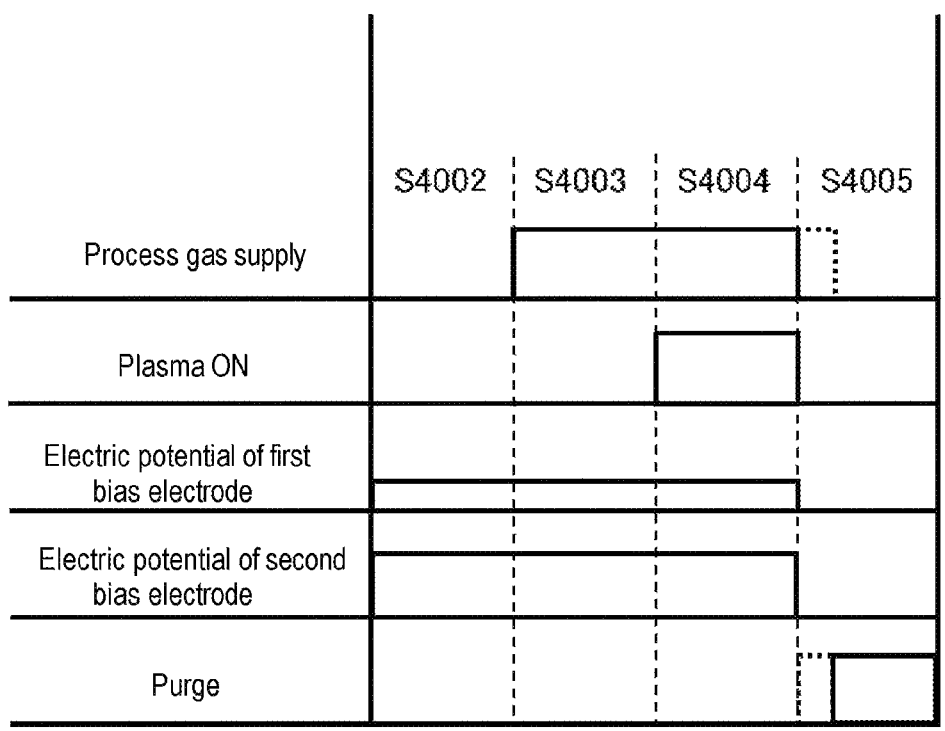
FIG. 31 illustrates a substrate processing sequence example according to another embodiment.

Furthermore, there is available a process sequence example illustrated in FIG. 31. FIG. 31 illustrates an example in which a process is performed by making the electric potential of the second bias electrode higher than the electric potential of the first bias electrode. By performing the process in this way, film thickness distribution A can be corrected to film thickness distribution A' as illustrated in FIG. 10.

Furthermore, there is available a process sequence example illustrated in FIG. 32. FIG. 32 illustrates an example in which a process is performed by making the high-frequency power supplied to the first coil $250a$ higher than the high-frequency power supplied to the second coil $250b$. By performing the process in this way, film thickness distribution B can be corrected to film thickness distribution B' as illustrated in FIG. 12.

Figure 33:
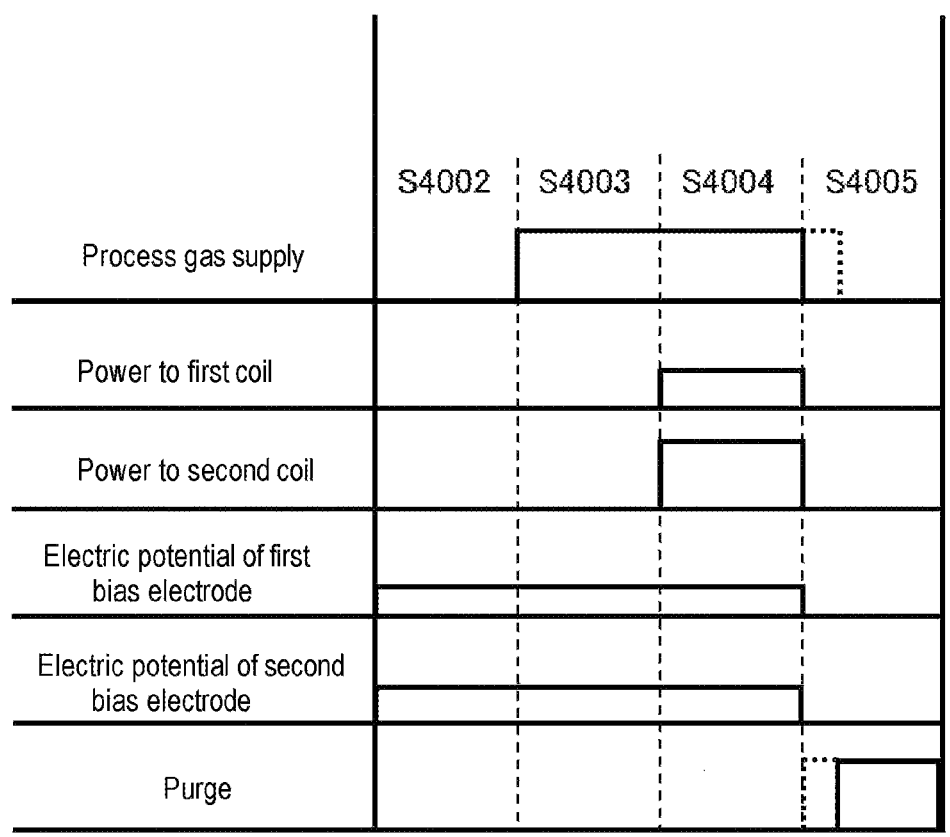
FIG. 33 illustrates a substrate processing sequence example according to another embodiment.

Furthermore, there is available a process sequence example illustrated in FIG. 33. FIG. 33 illustrates an example in which a process is performed by making the high-frequency power supplied to the first coil $250a$ lower than the high-frequency power supplied to the second coil $250b$. By performing the process in this way, film thickness distribution A can be corrected to film thickness distribution A' as illustrated in FIG. 10.

Figure 34:
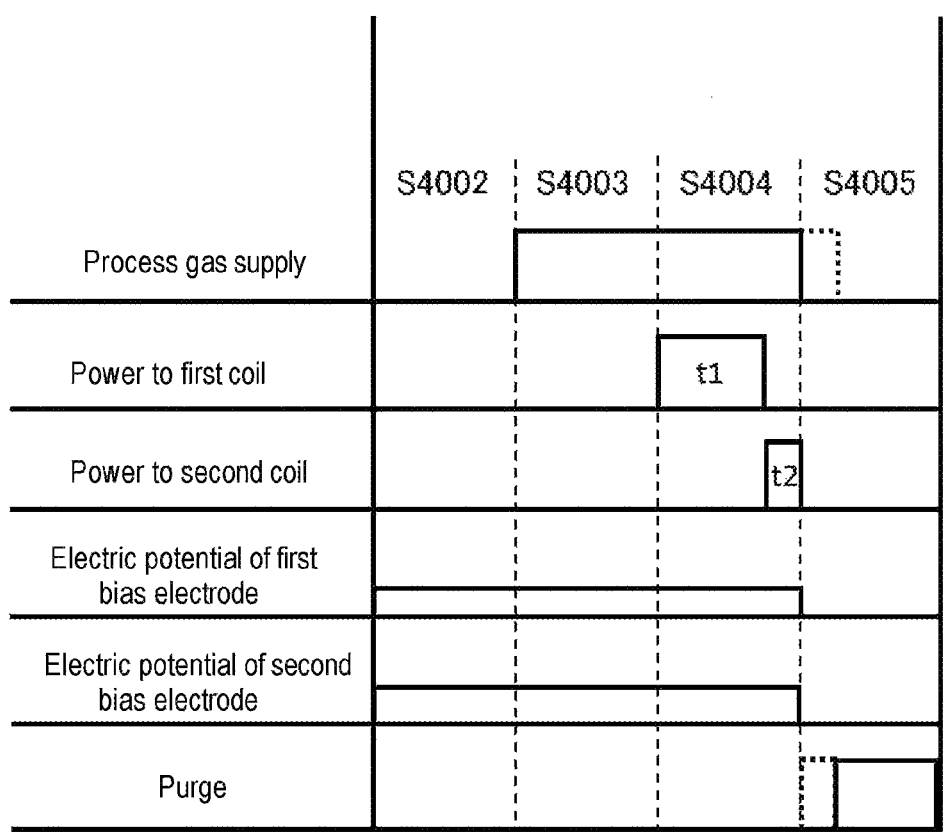
FIG. 34 illustrates a substrate processing sequence example according to another embodiment.

Furthermore, there is available a process sequence example illustrated in FIG. 34. FIG. 34 illustrates a sequence in which high-frequency power is supplied to the first coil $250a$ for a time period t1 and, then, high-frequency power is supplied to the second coil $250b$ for a time period t2. In this regard, the time period t1 is set to become longer than the time period t2. By performing the process in this way, film thickness distribution B can be corrected to film thickness distribution B' as illustrated in FIG. 12. In this process sequence example, the high-frequency power is supplied to the second coil $250b$ after supplying the high-frequency power to the first coil $250a$. Conversely, the high-frequency power may be supplied to the first coil $250a$ after supplying the high-frequency power to the second coil $250b$.

Figure 35:
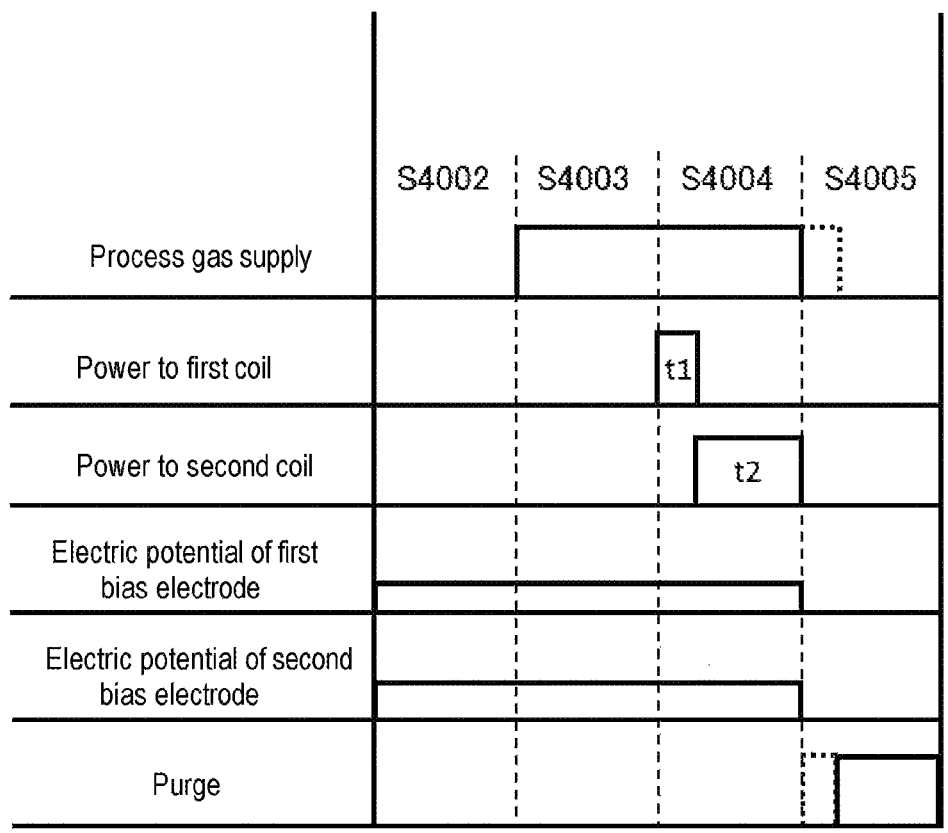
FIG. 35 illustrates a substrate processing sequence example according to another embodiment.

Furthermore, there is available a process sequence example illustrated in FIG. 35. FIG. 35 illustrates a sequence in which a time period t1 is set to become shorter than a time period t2. By performing the process in this way, film thickness distribution A can be corrected to film thickness distribution A' as illustrated in FIG. 10. In this process sequence example, the high-frequency power is supplied to the second coil $250b$ after supplying the high-frequency power to the first coil $250a$. Conversely, the high-frequency power may be supplied to the first coil $250a$ after supplying the high-frequency power to the second coil $250b$.

Figure 36:
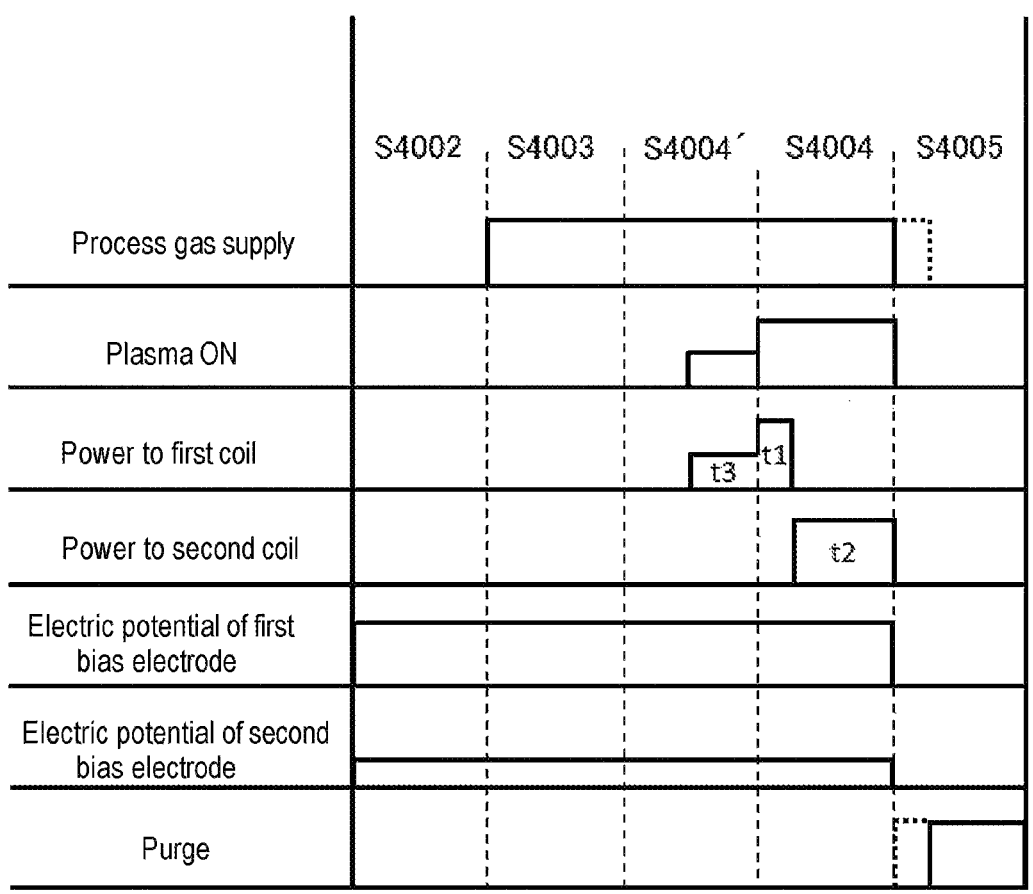
FIG. 36 illustrates a substrate processing sequence example according to another embodiment.

When the first interlayer insulating film is polished, it is sometimes the case that a defect called erosion is generated at a location where gate electrodes are dense. The erosion is a phenomenon that a film is scraped off in a direction perpendicular to the substrate 200. The generation distribution of the erosion may be such that the generation amounts of the erosion become different at the center side and the periphery side of the substrate 200. For example, a larger amount of erosion may be generated at the center side of the substrate 200 than at the periphery side of the substrate 200. In this case, as illustrated in FIG. 36, a step S4004' of generating plasma with the first coil $250a$ for a time period t3 in advance may be performed prior to the activation step S4004. Thus, the film thickness of the second interlayer insulating film can be corrected after filling the erosion that exists at the center side of the substrate 200. It is therefore possible to suppress generation of local irregularities at the center side of the substrate 200. That is to say, it is possible to improve the flatness of the second interlayer insulating film. In the case where a larger amount of erosion is generated at the periphery side of the substrate 200 than at the center side of the substrate 200, the second coil $250b$ rather than the first coil $250a$ may be used at the step S4004'. Thus, the film thickness of the second interlayer insulating film can be corrected after filling the erosion that exists at the periphery side of the substrate 200. In this process sequence, there is illustrated an example in which the plasma generation timing is controlled using the first coil $250a$ and the second coil $250b$. However, the present disclosure is not limited thereto. The plasma generation timing or the plasma density may be controlled using the configurations such as the first electromagnet $250g$, the second electromagnet $250h$, the first bias electrode $219a$, the second bias electrode $219b$, the first heater $213a$, the second heater $213b$, and so forth.

Furthermore, it is sometime the case that, in addition to the erosion, defects called dishing and thinning are generated in the first interlayer insulating film which has been subjected to the polishing step S102. The generation distributions of the dishing and the thinning may become different at the center side and the periphery side of the substrate 200. It may be possible to employ a configuration for correcting these defects.

In the forgoing descriptions, there has been illustrated an example in which plasma is generated within the process chamber 201 using the first coil $250a$, the first electromagnet $250g$ and the second electromagnet $250h$. However, the present disclosure is not limited thereto. For example, it may be configured so that plasma is generated within the process chamber 201 using the second coil $250b$, the first electromagnet $250g$ and the second electromagnet $250h$ without installing the first coil $250a$. In the case of using only the second coil $250b$, plasma is generated mainly in the second plasma generating region 252. However, by using one or both of the first electromagnet $250g$ and the second electromagnet $250h$, the active species generated in the second plasma generating region can be diffused toward the center of the substrate 200, thereby adjusting the processing distribution.

While descriptions have been made by dividing the wafer into the central surface and the peripheral surface, the present disclosure is not limited thereto. The thickness of the silicon-containing film may be controlled in radially subdivided regions. For example, the wafer 200 may be divided into three regions such as a central surface, a peripheral surface and a surface between the central surface and the peripheral surface.

In the foregoing descriptions, the diameter of the first electromagnet $250g$ and the diameter of the second electromagnet $250h$ are set equal to each other. However, the present disclosure is not limited thereto. For example, the diameter of the second electromagnet $250h$ may be set larger than the diameter of the first electromagnet $250g$. The diameter of the first electromagnet $250g$ may be set larger than the diameter of the second electromagnet $250h$.

In the foregoing descriptions, there has been illustrated an example in which the first electromagnet $250g$ and the second electromagnet $250h$ are kept stationary. However, the present disclosure is not limited thereto. An up/down operation mechanism may be installed in each of the electromagnets so that the positions of the electromagnets can be changed depending on the kind of processing.

In the foregoing descriptions, the silicon nitride film has been described as an example of the hard mask. However, the present disclosure is not limited thereto. For example, the hard mask may be a silicon oxide film.

Furthermore, the hard mask is not limited to the silicon oxide film or the silicon nitride film. A pattern may be formed by an oxide film, a nitride film, a carbide film, an oxynitride film, a metal film or a composite film thereof, which contains different elements.

In the foregoing descriptions, the 300 mm Si wafer has been described as an example. However, the present disclosure is not limited thereto. Use of a substrate of 450 mm or more helps enhance the effects achieved. In the case of a large substrate, the influence of the polishing step S102 becomes more prominent. That is to say, the film thickness difference of the insulating film 2005a and the insulating film 2005b becomes larger. Furthermore, the influence on the polishing step S102 of the in-plane film quality distribution of the first insulating film formed at the first insulating film forming step S101 is increased. This poses a problem in that the film thickness difference becomes larger. This problem may possibly be solved by optimizing the conditions of the first insulating film forming step S101 and the polishing step S102. However, a great deal of time and cost is required in optimizing the conditions without affecting the respective steps. In contrast, by providing the aforementioned correction step, the film can be corrected without having to optimize the conditions of the first insulating film forming step S101 and the polishing step S102.

Furthermore, in the foregoing descriptions, there has been illustrated an example in which the first interlayer insulating film forming apparatus 100a, the polishing apparatus 100b, the measuring apparatus 100c and the second interlayer insulating film forming apparatus 100d are installed within the same processing system 4000. However, the present disclosure is not limited thereto. For example, it may be possible to employ a processing system that includes only one of the first interlayer insulating film forming apparatus 100a, the polishing apparatus 100b, the measuring apparatus 100c and the second interlayer insulating film forming apparatus 100d, or a processing system 4000 that includes a combination of two or more of the first interlayer insulating film forming apparatus 100a, the polishing apparatus 100b, the measuring apparatus 100c and the second interlayer insulating film forming apparatus 100d.

Furthermore, in the foregoing descriptions, there has been described one of processes of manufacturing a semiconductor device. However, the present disclosure is not limited thereto. The present disclosure may be applied to one of back-end processes including similar steps. Furthermore, the present disclosure may be applied to substrate processing techniques such as a patterning process of a liquid crystal panel manufacturing process, a patterning process of a solar cell manufacturing process, a patterning process of a power device manufacturing process, or the like.

<Aspects of the Present Disclosure>

Hereinafter, some aspects of the present disclosure will be additionally described as supplementary notes.

(Supplementary Note 1)

According to one aspect, there is provided a method of manufacturing a semiconductor device or a substrate processing method, including:

receiving film thickness distribution data of a polished first insulating film of a substrate;
calculating processing data for reducing a difference between a film thickness at a center side of the substrate and a film thickness at a periphery side of the substrate, based on the film thickness distribution data;
loading the substrate into a process chamber;
supplying a process gas to the substrate; and
correcting a film thickness of the first insulating film based on the processing data by activating the process gas so that a concentration of active species of the process gas generated at the center side of the substrate differs from a concentration of active species of the process gas generated at the periphery side of the substrate.

(Supplementary Note 2)

In the method of Supplementary Note 1, if the film thickness distribution data are such that the film thickness at the periphery side of the substrate is smaller than the film thickness at the center side of the substrate, the act of correcting the film thickness may be performed in a state in which a magnetic force generated from a lateral side of the substrate is made larger than a magnetic force generated from an upper side of the substrate.

(Supplementary Note 3)

In the method of Supplementary Note 1 or 2, if the film thickness distribution data are such that the film thickness at the periphery side of the substrate is smaller than the film thickness at the center side of the substrate, the act of correcting the film thickness may be performed by activating the process gas while making high-frequency power supplied from the lateral side of the substrate higher than high-frequency power supplied from the upper side of the substrate.

(Supplementary Note 4)

In the method of any one of Supplementary Notes 1 to 3, if the film thickness distribution data are such that the film thickness at the periphery side of the substrate is smaller than the film thickness at the center side of the substrate, the act of correcting the film thickness may be performed by making an electric potential at the periphery side of the substrate lower than an electric potential at the center side of the substrate.

(Supplementary Note 5)

In the method of Supplementary Note 1, if the film thickness distribution data are such that the film thickness at the center side of the substrate is smaller than the film thickness at the periphery side of the substrate, the act of correcting the film thickness may be performed in a state in which a magnetic force generated from an upper side of the substrate is made larger than a magnetic force generated from a lateral side of the substrate.

(Supplementary Note 6)

In the method of Supplementary Note 1 or 5, if the film thickness distribution data are such that the film thickness at the center side of the substrate is smaller than the film thickness at the periphery side of the substrate, the act of correcting the film thickness may be performed by activating the process gas while making high-frequency power supplied from the upper side of the substrate higher than high-frequency power supplied from the lateral side of the substrate.

(Supplementary Note 7)

In the method of any one of Supplementary Notes 1, 5 and 6, if the film thickness distribution data are such that the film thickness at the center side of the substrate is smaller than the film thickness at the periphery side of the substrate, the act of correcting the film thickness may be performed by making an electric potential at the center side of the substrate lower than an electric potential at the periphery side of the substrate.

(Supplementary Note 8)

In the method of any one of Supplementary Notes 1 to 7, the first insulating film may include a first element and, in the act of correcting the film thickness, the film thickness distribution may be corrected by forming a second insulating film including the first element on the first insulating film.
(Supplementary Note 9)
In the method of Supplementary Note 8, after the act of correcting the film thickness, patterning the first insulating film and the second insulating film may be performed.
(Supplementary Note 10)
In the method of any one of Supplementary Notes 1 to 9, before the act of correcting the film thickness, the film thickness of the polished first insulating film may be measured.
(Supplementary Note 11)
According to another aspect, there is provided a program or a computer-readable recording medium storing the program, wherein the program causes a computer to execute:
 a process of receiving film thickness distribution data of a polished first insulating film of a substrate;
 a process of calculating processing data for reducing a difference between a film thickness at a center side of the substrate and a film thickness at a periphery side of the substrate, based on the film thickness distribution data;
 a process of loading the substrate into a process chamber;
 a process of supplying a process gas to the substrate; and
 a process of correcting a film thickness of the first insulating film based on the processing data by activating the process gas so that a concentration of active species of the process gas generated at the center side of the substrate differs from a concentration of active species of the process gas generated at the periphery side of the substrate.
(Supplementary Note 12)
According to a further aspect, there is provided a substrate processing apparatus, including:
 a reception part configured to receive film thickness distribution data of a polished first insulating film of a substrate;
 a calculation part configured to calculate processing data for reducing a difference between a film thickness at a center side of the substrate and a film thickness at a periphery side of the substrate, based on the film thickness distribution data;
 a process chamber configured to accommodate the substrate;
 a process gas supply part configured to supply a process gas into the process chamber;
 an activation part configured to activate the process gas; and
 a control part configured to control the process gas supply part and the activation part based on the processing data so as to correct a film thickness of the first insulating film by activating the process gas so that a concentration of active species of the process gas supplied to the top portion of the substrate in the center side differs from a concentration of active species of the process gas supplied to the top portion of the substrate in the periphery side.

According to the present disclosure in some embodiments, it is possible to suppress a variation in semiconductor device characteristics.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
 receiving film thickness distribution data indicative of a film thickness distribution of a polished first insulating film of a substrate;
 calculating processing data for reducing a difference between a film thickness at a center side of the substrate and a film thickness at a periphery side of the substrate, based on the film thickness distribution data;
 loading the substrate into a process chamber;
 supplying a process gas to the substrate; and
 correcting the film thickness distribution of the first insulating film by activating the process gas, based on the processing data, to form a second insulating film on the first insulating film, a concentration of active species of the activated process gas generated at the center side of the substrate differing from a concentration of active species of the activated process gas generated at the periphery side of the substrate.

2. The method of claim 1, wherein if the film thickness distribution data are such that the film thickness at the periphery side of the substrate is smaller than the film thickness at the center side of the substrate, the act of correcting the film thickness distribution is performed in a state in which a magnetic force generated from a lateral side of the substrate is made larger than a magnetic force generated from an upper side of the substrate.

3. The method of claim 1, wherein if the film thickness distribution data are such that the film thickness at the periphery side of the substrate is smaller than the film thickness at the center side of the substrate, the act of correcting the film thickness distribution is performed by activating the process gas while making high-frequency power supplied from a lateral side of the substrate higher than high-frequency power supplied from an upper side of the substrate.

4. The method of claim 2, wherein if the film thickness distribution data are such that the film thickness at the periphery side of the substrate is smaller than the film thickness at the center side of the substrate, the act of correcting the film thickness distribution is performed by activating the process gas while making high-frequency power supplied from the lateral side of the substrate higher than high-frequency power supplied from the upper side of the substrate.

5. The method of claim 1, wherein if the film thickness distribution data are such that the film thickness at the periphery side of the substrate is smaller than the film thickness at the center side of the substrate, the act of correcting the film thickness distribution is performed by making an electric potential at the periphery side of the substrate lower than an electric potential at the center side of the substrate.

6. The method of claim 2, wherein if the film thickness distribution data are such that the film thickness at the periphery side of the substrate is smaller than the film thickness at the center side of the substrate, the act of correcting the film thickness distribution is performed by making an electric potential at the periphery side of the substrate lower than an electric potential at the center side of the substrate.

7. The method of claim 3, wherein if the film thickness distribution data are such that the film thickness at the periphery side of the substrate is smaller than the film thickness at the center side of the substrate, the act of correcting the film thickness distribution is performed by making an electric potential at the periphery side of the substrate lower than an electric potential at the center side of the substrate.

8. The method of claim 1, wherein if the film thickness distribution data are such that the film thickness at the center side of the substrate is smaller than the film thickness at the periphery side of the substrate, the act of correcting the film thickness distribution is performed in a state in which a magnetic force generated from an upper side of the substrate is made larger than a magnetic force generated from a lateral side of the substrate.

9. The method of claim 1, wherein if the film thickness distribution data are such that the film thickness at the center side of the substrate is smaller than the film thickness at the periphery side of the substrate, the act of correcting the film thickness distribution is performed by activating the process gas while making high-frequency power supplied from an upper side of the substrate higher than high-frequency power supplied from a lateral side of the substrate.

10. The method of claim 8, wherein if the film thickness distribution data are such that the film thickness at the center side of the substrate is smaller than the film thickness at the periphery side of the substrate, the act of correcting the film thickness distribution is performed by activating the process gas while making high-frequency power supplied from an upper side of the substrate higher than high-frequency power supplied from a lateral side of the substrate.

11. The method of claim 1, wherein if the film thickness distribution data are such that the film thickness at the center side of the substrate is smaller than the film thickness at the periphery side of the substrate, the act of correcting the film thickness distribution is performed by making an electric potential at the center side of the substrate lower than an electric potential at the periphery side of the substrate.

12. The method of claim 8, wherein if the film thickness distribution data are such that the film thickness at the center side of the substrate is smaller than the film thickness at the periphery side of the substrate, the act of correcting the film thickness distribution is performed by making an electric potential at the center side of the substrate lower than an electric potential at the periphery side of the substrate.

13. The method of claim 9, wherein if the film thickness distribution data are such that the film thickness at the center side of the substrate is smaller than the film thickness at the periphery side of the substrate, the act of correcting the film thickness distribution is performed by making an electric potential at the center side of the substrate lower than an electric potential at the periphery side of the substrate.

14. The method of claim 1, wherein the first insulating film includes a first element and the second insulating film includes the first element.

15. The method of claim 14, wherein after the act of correcting the film thickness distribution, patterning the first insulating film and the second insulating film is performed.

16. The method of claim 1, wherein before the act of correcting the film thickness distribution, the film thickness of the first insulating film is measured.

* * * * *